(12) United States Patent
Funamoto et al.

(10) Patent No.: US 7,336,030 B2
(45) Date of Patent: Feb. 26, 2008

(54) ELECTRO-OPTIC DEVICE, SEMICONDUCTOR DEVICE, ELECTRO-OPTIC DEVICE SUBSTRATE, MANUFACTURING METHODS THEREOF, AND ELECTRONIC APPARATUS

(75) Inventors: Tatsuaki Funamoto, Fujimi-machi (JP); Tomoyuki Ito, Okaya (JP); Ryoichi Nozawa, Tatsuno-machi (JP)

(73) Assignee: Seiko Epson Corporation, Tokyo (JP)

( * ) Notice: Subject to any disclaimer, the term of this patent is extended or adjusted under 35 U.S.C. 154(b) by 488 days.

(21) Appl. No.: 10/954,242

(22) Filed: Oct. 1, 2004

(65) Prior Publication Data

US 2005/0116632 A1    Jun. 2, 2005

(30) Foreign Application Priority Data

Nov. 27, 2003 (JP) .............................. 2003-397167
Apr. 14, 2004 (JP) .............................. 2004-119317
Jun. 30, 2004 (JP) .............................. 2004-193512

(51) Int. Cl.
*H01J 1/62* (2006.01)

(52) U.S. Cl. ...................................... 313/506; 313/509

(58) Field of Classification Search ......... 313/498–512
See application file for complete search history.

(56) References Cited

U.S. PATENT DOCUMENTS 6,380,672 B1    4/2002  Yudasaka

2003/0127657 A1 *  7/2003  Park ............................. 257/79
2004/0242111 A1 * 12/2004  Morii ........................... 445/24

FOREIGN PATENT DOCUMENTS

| EP | 0 989 778 A1 | 3/2000 |
|---|---|---|
| JP | 2001-291583 | 10/2001 |
| JP | B2-3328297 | 7/2002 |
| JP | 2003-101843 | 4/2003 |
| WO | WO99/10862 | 3/1999 |

* cited by examiner

*Primary Examiner*—Joseph Williams
*Assistant Examiner*—Bumsuk Won
(74) *Attorney, Agent, or Firm*—Oliff & Berridge, PLC

(57) ABSTRACT

A pixel structure is provided in which a functional thin film having a uniform thickness can be formed in a pixel region, and an electro-optic device is obtained having superior uniformity of light brightness by the use of the above pixel structure. The functional thin film is formed on a thin film-forming surface surrounded by a partition for defining the pixel region. In this step, since the partition described above is formed of a first partition having a lyophilic surface and a second partition which is provided thereon and which has a lyophobic surface, and the first partition has parts which are not covered with the second partition, a liquid material for forming the functional thin film, which is filled inside the partition, can be formed into a film having a uniform thickness after drying due to the interaction between the lyophilic and the lyophobic properties.

13 Claims, 29 Drawing Sheets

ELECTRO-OPTIC DEVICE, SEMICONDUCTOR DEVICE, ELECTRO-OPTIC DEVICE SUBSTRATE, MANUFACTURING METHODS THEREOF, AND ELECTRONIC APPARATUS

BACKGROUND OF THE INVENTION

1. Field of Invention

The present invention relates to an electro-optic device formed of thin films, an electro-optic device substrate used for this electro-optic device, and a semiconductor device. In addition, the present invention relates to manufacturing methods thereof mentioned above and an electronic apparatus using the electro-optic device.

2. Description of Related Art

In recent years, in manufacturing processes of organic electroluminescent (hereinafter referred to as "EL") elements, color filters, and the like, pattern-forming methods using an ink-jet process (a manufacturing method using a liquid-droplet discharge method) have drawn attention. For example, in an electro-optic device using organic EL thin films, by using this manufacturing method, a plurality of pixels is formed in predetermined regions on a display substrate to make a predetermined pattern, and display is then performed by controlling light emission in each pixel. Hereinafter, a method for forming a thin film using an ink-jet process will be described with reference to an example of an electro-optic device using organic EL thin films.

FIG. 28 is a cross-sectional view of an important portion of a pixel of a conventional electro-optic device, and FIG. 29 is a schematic view showing a drying step in a process for forming thin films for a conventional electro-optic device. As described above, the organic EL thin films are formed in predetermined regions with a predetermined pattern. On a substrate, parting members (hereinafter referred to as "partitions") 242 having a convex cross-sectional shape are disposed between adjacent pixels so that a liquid material (thin film-forming liquid material) for organic EL films discharged by an ink-jet process is not allowed to flow into adjacent pixels. This partition is provided on a pixel electrode (not shown) formed on a substrate 260 and is composed of a first partition 243 and a second partition 244 formed thereon so as to surround a liquid-droplet filling region $R_s$. In this structure, an opening at a lower side of the second partition 244 is formed larger than an opening at an upper side of the first partition 243, so that the cross-section of the partition 242 has a step structure. In addition, the first partition 243 and the pixel electrode are formed of an inorganic material lyophilic to the thin film-forming liquid material, and the second partition 244 is formed of an organic material lyophobic to the thin film-forming liquid material.

In individual light-emission regions surrounded by the partitions, the thin film-forming liquid material is filled using an ink-jet process. At an initial stage, the surface of a liquid droplet has a convex shape protruding from the upper surface of the partition 244 as shown by a line segment L1 in FIG. 29. However, while this thin film-forming liquid material is dried, the surface of the liquid droplet is gradually descending as shown by line segments L1 to L4, and as a result, a thin film 245 having the surface as shown by the line segment L4 is formed. In this drying step, the liquid droplet is repelled by the surface of the partition 244 and tends to have an affinity for the surface of the first partition 243 and the surface of the pixel electrode, thereby forming an approximately flat organic EL thin film in the liquid-droplet filling region $R_s$ on the pixel electrode (see Patent Document 1). [Patent Document 1] Japanese Patent No. 3328297.

SUMMARY OF THE INVENTION

However, according to the above method, there has been a problem in that an organic EL thin film having a uniform thickness cannot be formed on the pixel electrode when a long light-emission region having two semicircle-shaped ends is formed as shown in FIG. 30 or when a light-emission region having corner portions surrounded by the partition 242 is formed as shown in FIG. 31.

That is, when the light-emission region has a long oval shape as shown in FIG. 30, a liquid droplet 250 of the thin film-forming liquid material filled by an ink-jet process first spreads over the entire region surrounded by the partition 242 (see a left side view in the figure); however, subsequently, this liquid droplet tends to gradually form a spherical shape due to the surface tension thereof, and hence it finally remains at a position in the vicinity of a central portion of the region surrounded by the partition 242. In addition, when a liquid droplet is filled in a region having corner portions surrounded by the partition 242 as shown in FIG. 31, the liquid droplet 250 of the thin film-forming liquid material first spreads over the entire region surrounded by the partition 242 (see a left side view in the figure); however, subsequently, this liquid droplet finally remains at a position in the vicinity of a central portion of the region as is the case described above. Accordingly, in both cases described above, in the vicinity of the peripheral portions of the light-emission region, that is, in the vicinity of the two ends in the longitudinal direction when the light-emission region has a long shape, or in the vicinity of the corner portions when the light-emission region has corner portions, the thickness of the organic EL thin film is decreased, and the thickness thereof at the central portion of the light-emission region is increased. As a result, due to the variation in film thickness described above, a problem of uneven light brightness within one pixel occurs.

The present invention was made in consideration of the problem described above, and an object of the present invention is to provide an electro-optic device which has the structure in which functional thin film layers each having a uniform film thickness and film quality can be formed in partition regions surrounded by the partitions so as to be able to perform superior display having uniform light brightness, and is to provide an electronic apparatus using this electro-optic device. In addition, another object of the present invention is to provide manufacturing methods for manufacturing the electro-optic device and the electronic apparatus described above.

In order to solve the problem described above and to achieve the above objects, in accordance with one aspect of the present invention, there is provided an electro-optic device which comprises thin films provided on thin film-forming surfaces surrounded by partition members each defining a predetermined partition region. In the electro-optic device described above, the partition members each comprise a first partition having a lyophilic surface and a second partition which is provided on the first partition and which has a lyophobic surface, the first partition has at least one exposed part which is not covered with the second partition, and the thin films are functional thin film layers.

In the electro-optic device of the present invention, on the first partition having a surface lyophilic to a thin film-forming liquid material, the second partition is provided so that at least one predetermined part of the first partition is exposed. When the lyophilic property is imparted to the surface of the first partition as described above, superior wettability between the thin film-forming liquid material and the surface of the first partition can be obtained. In addition, after the thin film-forming liquid material is filled, a droplet thereof uniformly and reliably wets the surface of the region surrounded by the first partition and spreads thereon, and hence the thin film can be uniformly formed. In addition, since the lyophobic property is imparted to the surface of the second partition, the thin film-forming liquid material is likely to be separated from the second partition when being dried, and even when being filled so as to exceed the height of the second partition, the thin film-forming liquid material will not flow outside over the second partition due to the surface tension of the thin film-forming liquid material.

Furthermore, in the present invention, since the exposed parts of the first partition having a lyophilic property have predetermined shapes in the predetermined region, at a position of the first partition at which the area of the exposed part is large or at a position at which the exposed part has a unique shape, the thin film-forming liquid material is dried while being strongly pulled toward the exposed parts of the first partition described above. Accordingly, the thin film-forming liquid material is prevented from gathering at a central portion of the region surrounded by the first partition and the second partition which is caused by the surface tension of the thin film-forming liquid material. As a result, at the central portion and the peripheral portion of the region surrounded by the first partition and the second partition, the thin film-forming liquid material can be dried without causing any variation in thickness.

Since the thin film thus formed has a uniform thickness in the entire region surrounded by the first partition and the second partition, a functional thin film layer (light-emitting layer) having a uniform thickness can be obtained, and as a result, unevenness and variation in light brightness within one pixel caused by variation in thickness of the thin film are not generated. Hence, the present invention can effectively provide a high quality electro-optic device in which the quality is not degraded due to the variation in thickness.

In addition, in order to solve the problem described above and to achieve the above objects, in the above electro-optic device according to the present invention, the exposed parts of the first partition are flat surfaces approximately parallel to corresponding one of the thin film-forming surfaces, and exposed areas of the flat surfaces in the predetermined partition region are different from each other.

According to the present invention, the structure is formed so that the exposed areas of the flat surfaces of the first partition in the predetermined region are different from each other. Hence, when being dried, the thin film-forming liquid material is being strongly pulled toward flat surfaces of the first partition each having a large exposed area. Accordingly, the thin film-forming liquid material is prevented from gathering at the central portion of the region surrounded by the first partition and the second partition which is caused by the surface tension. Hence, the thin film-forming liquid material is dried without generating any variation in film thickness between the central portion and the peripheral portion of the region surrounded by the first partition and the second partition.

As a result, since the film thickness is uniform in the entire region surrounded by the first partition and the second partition, a functional thin film layer (light-emitting layer) having a uniform thickness can be obtained, and unevenness and variation in light brightness within one pixel caused by variation in film thickness of the thin film are not generated. Hence, the present invention can effectively provide a high quality electro-optic device in which the quality is not degraded due to the variation in thickness.

In addition, according to a preferable structure of the present invention, the first partition is formed so that the thin film-forming surface surrounded by the partition has at least one corner portion, and the second partition is formed so that an exposed area of a flat surface of the first partition in the vicinity of the corner portion is larger than an exposed area of a flat surface of the first partition at a position other than that in the vicinity of the corner portion. Accordingly, a thin film having a uniform film thickness can be formed in the entire region including every corner thereof surrounded by the partition. For example, in a pixel of an organic EL device display having at least one corner portion, a functional thin film layer (light-emitting layer) having a superior thickness uniformity can be reliably formed. As a result, the present invention can effectively provide a high quality electro-optic device in which the quality is not degraded due to the variation in film thickness of the functional thin film layer (light-emitting layer).

In addition, according to a preferable structure of the present invention, the second partition is formed so that an opening thereof in the vicinity of the corner portion has an arc shape, and an inclined angle of the second partition in the vicinity of the corner portion is smaller than that at a position other than that in the vicinity of the corner portion. That is, the inclined angle of a part of the second partition, which is formed in the vicinity of the corner portion and which has an approximately arc-shape, is formed smaller than a part of the second partition at a position other than that in the vicinity of the corner portion. When the second partition is formed from a liquid material containing an organic resin, the compression stress of a second partition material applied to the arc portion is larger than that applied to a straight portion, and hence the inclined angle of the second partition having the approximately arc shape in the vicinity of the corner portion of the opening is smaller than that of the second partition in the vicinity of the straight portion (each of the long side portions and the short side portions) of the opening. As a result, the distance between the surface of the thin film-forming liquid material and the thin film-forming surface surrounded by the first partition can be increased. Accordingly, the thin film-forming liquid material is prevented from gathering at the central portion of the thin film-forming surface which is caused by the surface tension.

In addition, according to a preferable structure of the present invention, the first partition is formed so that the thin film-forming surface surrounded by the partition has a long shape, and the second partition is formed so that an exposed area of flat surfaces of the first partition in the vicinity of two end portions of the long-shaped thin film-forming surface in the longitudinal direction is larger than an exposed area of flat surfaces of the first partition at positions other than that in the vicinity of said two end portions. Accordingly, a thin film having a uniform film thickness can be easily and reliably formed in the entire long-shaped region surrounded by the partition. For example, in a pixel having a long shape which is formed in combination with semicircles and a rectangle, a functional thin film layer (light-emitting layer) having a uniform thickness can be reliably formed in the entire pixel region. As a result, the present invention can provide a high quality electro-optic device in which the quality is not degraded due to the variation in film thickness of the functional thin film layer (light-emitting layer).

In addition, according to a preferable structure of the present invention, the second partition has an opening having arc shapes in the vicinity of the two end portions of the long-shaped thin film-forming surface in the longitudinal direction, and an inclined angle of the second partition in the vicinity of each of the two end portions described above is smaller than that at each of positions other than that in the vicinity of said two end portions. That is, the inclined angle of a part of the second partition, which is formed in the vicinity of each of the two end portions of the long-shaped thin film-forming surface in the longitudinal direction and which has an approximately arc-shape, is formed smaller than a part of the second partition in the vicinity of each of the straight portions (long side portions) of the long-shaped thin film-forming surface. For example, when the second partition is formed from a liquid material containing an organic resin, the compression stress of the second partition material applied to the arc portion is larger than that applied to the straight portion, and hence the inclined angle of the second partition having the approximately arc shape located at each of the two ends of the long-shaped thin film-forming surface in the longitudinal direction is smaller than that of the second partition in the vicinity of the straight portion (each of the long side portions and the short side portions) of the long-shaped thin film-forming surface. Accordingly, the distance between the surface of the thin film-forming liquid material and the thin film-forming surface surrounded by the first partition can be increased. As a result, the thin film-forming liquid material is prevented from gathering at the central portion of the thin film-forming surface which is caused by the surface tension.

In addition, in order to solve the problem described above and to achieve the above objects, in the electro-optic device according to said one aspect of the present invention, described above, the first partition has at least one inclined portion as the exposed part which is not covered with the second partition.

As described above, when the first partition having the inclined portion exposed in the partition region is provided, since the surface area of the first partition can be increased in the partition region, in forming the functional thin film layer (electron transport layer or light-emitting layer) by applying a liquid material, the liquid material can be preferably held at the peripheral portion of the partition region at which this inclined portion is present. Accordingly, the liquid material is prevented from being changed into a spherical shape in the partition region, and as a result, a functional thin film layer having a uniform thickness can be formed in the partition region.

In addition, since the first partition has the inclined shape extending into the partition region, while the length of the first partition extending into the partition region along the surface thereof is not so much increased, the surface area of the first partition can be increased, and hence a wide region can be ensured for forming a functional thin film. In particular, when the functional thin film is a light-emitting element, bright display can be effectively obtained. In addition, the present invention can provide a high quality electro-optic device in which the quality is not degraded due to the variation in film thickness of the functional thin film layer.

According to a preferable structure of the present invention, the inclined portion is provided along a peripheral portion of the partition region. By this structure, since the liquid material can be held by the first partition all along the periphery of the partition region, the uniformity of the functional layer to be formed can be further improved.

In addition, according to another preferable structure of the present invention, the inclined portion may be provided at an end portion of the partition region in the longitudinal direction when viewed in plan view. The structure described above is characterized by that the partition region has an approximately rectangular shape when viewed in plan view and that the inclined portion is provided along a short side of the partition region. The liquid material in the partition region is likely to change its shape particularly when the plane shape of the partition region is a long shape extending in one direction. Accordingly, when the inclined portion of the first partition is provided at the end portion in the longitudinal direction as is the structure described above, the compression stress applied to the liquid material can be controlled, and as a result, the liquid material can be effectively prevented from being unevenly distributed in the partition region. In addition, when the inclined portion is provided along the long side of the partition region, the same effect as that described above can also be obtained.

In addition as another preferable structure of the present invention, the partition region has an approximately polygonal shape when viewed in plan view, and the inclined portion is provided so as to correspond to at least one outwardly convex corner of the partition region. The uneven distribution of the liquid material described above is also liable to occur at the outwardly convex corner of the partition region. Accordingly, when the inclined portion of the first partition is provided so as to correspond to the corner as described above, the liquid material can be effectively prevented from being uneven distributed in the partition region.

The electro-optic device of the present invention may further comprise a substrate and circuit layers which are provided between the substrate and the partition members, in which each circuit layer has a protruding portion at a position at which the circuit layer is overlapped with the partition member in plan view. According to this structure, since the inclined portion of the first partition can be formed by the presence of the protruding portion described above, a member for forming the inclined portion is not necessarily provided between the circuit layer and the partition member, and hence an electro-optic device which can be effectively manufactured is realized.

In addition, according to a preferable structure of the present invention, the protruding portion of the circuit layer is preferably formed due to the presence of the conductive members provided for the circuit layer. According to this structure, since the protruding portion can be formed by the presence of the conductive members provided for the circuit layer and an insulating film formed to cover the conductive members, for example, when a drive element such as a thin film transistor is provided, a scanning line, a signal line, and the like, which are connected the drive element, can be used as the conductive members. In addition, the conductive members may be dummy wires which are not connected to the drive element. When the dummy wires are used, since the placement, thickness, and width thereof are not so strictly limited as compared to the wires connected to the drive element, the degree of freedom of placing the protruding portion is increased, and for example, even when the position of the inclined portion of the first partition is changed in accordance with the shape of the partition region, the formation of the inclined portion can be easily performed.

In the electro-optic device of the present invention, it is preferable that the first partition be primarily formed of an inorganic material and that the second partition be formed of an organic material. According to the structure described above, the first partition and the second partition having different surface properties from each other can be easily obtained.

In addition, according to the electro-optic device of the present invention, the function thin film layers are organic electroluminescent films. Accordingly, an organic electroluminescent film having superior thickness uniformity can be formed, and a high quality organic EL device can be provided in which the quality is not degraded due to the variation in film thickness of the organic electroluminescent film.

In addition, in order to solve the problem described above and to achieve the above objects, in accordance with another aspect of the present invention, there is provided a semiconductor device, which comprises thin films provided on thin film-forming surfaces surrounded by partition members each defining a predetermined partition region. In the semiconductor device described above, each of the partition members comprises a first partition having a lyophilic surface and a second partition which is provided on the first partition and which has a lyophobic surface, the first partition has at least one exposed part which is not covered with the second partition, and the thin films are semiconductor thin film layers.

In the semiconductor device of the present invention, described above, the semiconductor thin film layer is formed in the region surrounded by the first partition and the second partition, which have the same properties and the same structures as those in the case of the electro-optic device described above. Accordingly, the thin film to be obtained has a uniform thickness in the entire region surrounded by the first partition and the second partition, and hence a semiconductor thin film having a uniform thickness can be obtained. As a result, unevenness and variation in light brightness within one pixel caused by variation in film thickness of the thin film are not generated, and hence the present invention can effectively provides a high quality semiconductor device.

In addition, in order to solve the problem described above and to achieve the above objects, in accordance with another aspect of the present invention, there is provided an electro-optic device substrate, which comprises partition members each defining a predetermined partition region which includes a thin film-forming surface on which a thin film is to be provided. In the electro-optic device substrate described above, each of the partition members comprises a first partition having a lyophilic surface and a second partition which is provided on the first partition and which has a lyophobic surface, and the first partition has at least one exposed part which is not covered with the second partition.

According to the electro-optic device substrate of the present invention, a substrate can be provided in which functional thin film layers can be formed in the partition regions each surrounded by the first partition and the second partition, which have the same properties and the same structures as those in the case of the electro-optic device described above. Accordingly, unevenness and variation in light brightness within one pixel caused by variation in film thickness of the thin film are not generated, and hence the present invention can effectively provides a high quality electro-optic device substrate.

In order to solve the problem described above and to achieve the above objects, in accordance with another aspect of the present invention, there is provided a method for manufacturing an electro-optic device, which comprises: a first partition-formation step of forming first partitions on thin film-forming surfaces, the first partitions each having a surface lyophilic to a thin film-forming liquid material; a second partition-formation step of forming second partitions on the first partitions so as to form at least one predetermined exposed part of each of the first partitions, the second partitions each having a lyophobic surface; and a thin film-formation step of filling the thin film-forming liquid material in partition regions surrounded by the first partitions and the second partitions, followed by drying, for forming thin films.

In the above method for manufacturing an electro-optic device, of the present invention, the second partition is provided on the first partition having a surface lyophilic to the thin film-forming liquid material so that at least one predetermined part of the first partition is exposed. Since the surface of the first partition has a lyophilic property, superior wettability between the thin film-forming liquid material and the surface of the first partition can be obtained. In addition, when the thin film-forming liquid material is filled, the droplet thereof can uniformly and reliably wet the surface of the region surrounded by the first partition and spread thereon, and hence the thin film can be uniformly formed. Furthermore, since a lyophobic property is imparted to the surface of the second partition, the thin film-forming liquid material is likely to be separated from the second partition in drying, and even when an excessive amount of the thin film-forming liquid material over the height of the second partition is filled, the thin film-forming liquid material will not flow outside over the second partition due to the surface tension of the thin film-forming liquid material.

Furthermore, in the present invention, since the exposed parts of the first partition having a lyophilic property have predetermined shapes in the predetermined region, at a position of the first partition at which the area of the exposed part is large or at a position at which the exposed part has a unique shape, the thin film-forming liquid material is dried while being strongly pulled toward the exposed part of the first partition described above. Accordingly, the thin film-forming liquid material is prevented from gathering at the central portion of the region surrounded by the first partition and the second partition which is caused by the surface tension of the thin film-forming liquid material. As a result, at the central portion and the peripheral portion of the region surrounded by the first partition and the second partition, the thin film-forming liquid material can be dried without causing any variation in thickness.

Since the thin film thus formed has a uniform thickness in the entire region surrounded by the first partition and the second partition, a functional thin film layer (light-emitting layer) having a uniform thickness can be obtained, and as a result, unevenness and variation in light brightness within one pixel caused by variation in thin film thickness are not generated. Hence, the present invention can effectively provide a high quality electro-optic device in which the quality is not degraded due to the variation in thickness.

In addition, according to a preferable structure of the present invention, the exposed parts of the first partition are flat surfaces approximately parallel to the thin film-forming surface, and exposed areas of the flat surfaces of the first partition in the region are different from each other.

In the present invention, the exposed areas of the flat surface of the first partition are formed differently from each other. At a flat surface of the first partition having a large exposed area, the thin film-forming liquid material is dried while being strongly pulled to the flat surface side of the first partition described above. Accordingly, the thin film-forming liquid material is prevented from gathering at the central portion of the region surrounded by the first partition and the second partition. Hence, without causing any variation in film thickness between the central portion and the peripheral portion of the region surrounded by the first partition and the second partition, the thin film-forming liquid material can be dried.

As a result, the thin film can be formed to have a uniform thickness in the entire region surrounded by the first partition and the second partition. Hence, according to the method for manufacturing an electro-optic device, of the present invention, a functional thin film having superior thickness uniformity in the entire region surrounded by the partition can be easily and reliably formed, and hence, the present invention can effectively provide a high quality electro-optic device in which the quality is not degraded due to the variation in thickness of the thin film.

In addition, according to a preferable structure of the present invention, the exposed part of the first partition is an inclined portion exposed in the regions.

According to the above manufacturing method of the present invention, since the first partition having an inclined portion exposed in the partition region is formed in the partition-formation steps described above, a liquid material disposed in the partition region in the sequential thin film-formation step can be held by the inclined portion of the first partition having a lyophilic property and is then allowed to uniformly wet the surface of the partition region and spread thereon. Hence, a functional thin film having a uniform thickness and quality in the partition region can be formed, and as a result, a high quality electro-optic device can be formed.

In addition, according to the inclined portion formed by the manufacturing method of the present invention, while the length of the first partition extending along the surface of the substrate is not so much increased, the surface area of the extending portion of the first partition can be increased; hence, without decreasing the area in which the functional layer is formed, uniform wettability of the liquid material can be ensured.

In addition, according to a preferable structure of the present invention, in the thin film-formation step, an organic electroluminescent film is formed as the thin film. Accordingly, an organic electroluminescent film having superior film thickness uniformity can be formed, and a high quality organic El device can be provided in which the quality is not degraded due to the variation in film thickness of the organic electroluminescent film.

In order to solve the problem described above and to achieve the above objects, in accordance with another aspect of the present invention, there is provided a method for manufacturing a semiconductor device, which comprises: a first partition-formation step of forming first partitions on thin film-forming surfaces, the first partitions each having a surface lyophilic to a thin film-forming liquid material; a second partition-formation step of forming second partitions on the first partitions so as to form at least one predetermined exposed part of each of the first partitions, the second partitions each having a lyophobic surface; and a thin film-formation step of filling the thin film-forming liquid material in regions surrounded by the first partitions and the second partitions, followed by drying, for forming semiconductor thin films.

In the above method for manufacturing a semiconductor device, of the present invention, a semiconductor thin film layer is formed in the region surrounded by the first partition and the second partition, which have the same properties and the same structures as those of the electro-optic device described above. Accordingly, the thin film thus formed has a uniform thickness in the entire region surrounded by the first partition and the second partition, and hence a semiconductor thin film having a uniform thickness can be obtained. As a result, unevenness and variation in light brightness caused by variation in film thickness of the thin film are not generated within one pixel, and hence the present invention can effectively provides a high quality semiconductor device.

In order to solve the problem described above and to achieve the above objects, in accordance with another aspect of the present invention, there is provided a method for manufacturing an electro-optic device substrate, which comprises: a first partition-formation step of forming first partitions on thin film-forming surfaces, the first partitions each having a surface lyophilic to a thin film-forming liquid material; and a second partition-formation step of forming second partitions on the first partitions so as to form at least one predetermined exposed part of each of the first partitions, the second partitions each having a lyophobic surface.

In the electro-optic device substrate of the present invention, as described above, a functional thin film layer is to be formed in the region surrounded by the first partition and the second partition, which have the same properties and the same structures as those of the electro-optic device described above. Accordingly, the thin film to be formed has a uniform thickness in the entire region surrounded by the first partition and the second partition, and hence a functional thin film having a uniform thickness can be obtained. As a result, a high quality electro-optic device can be manufactured in which the quality is not degraded due to the variation in thickness of the thin film.

In addition, in accordance with another aspect of the present invention, there is provided an electronic apparatus comprising the electro-optic device described above. Hence, a high quality electronic apparatus can be realized.

DETAILED DESCRIPTION OF PREFERRED EMBODIMENTS

With reference to figures, an electro-optic device, a semiconductor device, an electro-optic device substrate, methods for manufacturing the devices and the substrate mentioned above, and an electronic apparatus will be described. Hereinafter, an organic electroluminescent (EL) display apparatus will be described by way of example which uses organic EL thin films, that is, semiconductor thin films, as light-emitting layers. However, the present invention is not limited to the following descriptions, and modification may be optionally made. In addition, cross-sectional views of electro-optic devices used in the following examples are schematically shown, and hence the relationship between the thickness and the width of each layer and the ratios of thicknesses of individual layers are different from those of the actual structure.

EXAMPLE 1-1

<Electro-Optic Device, Semiconductor Device, and Electro-Optic Device Substrate>

Figure 1:
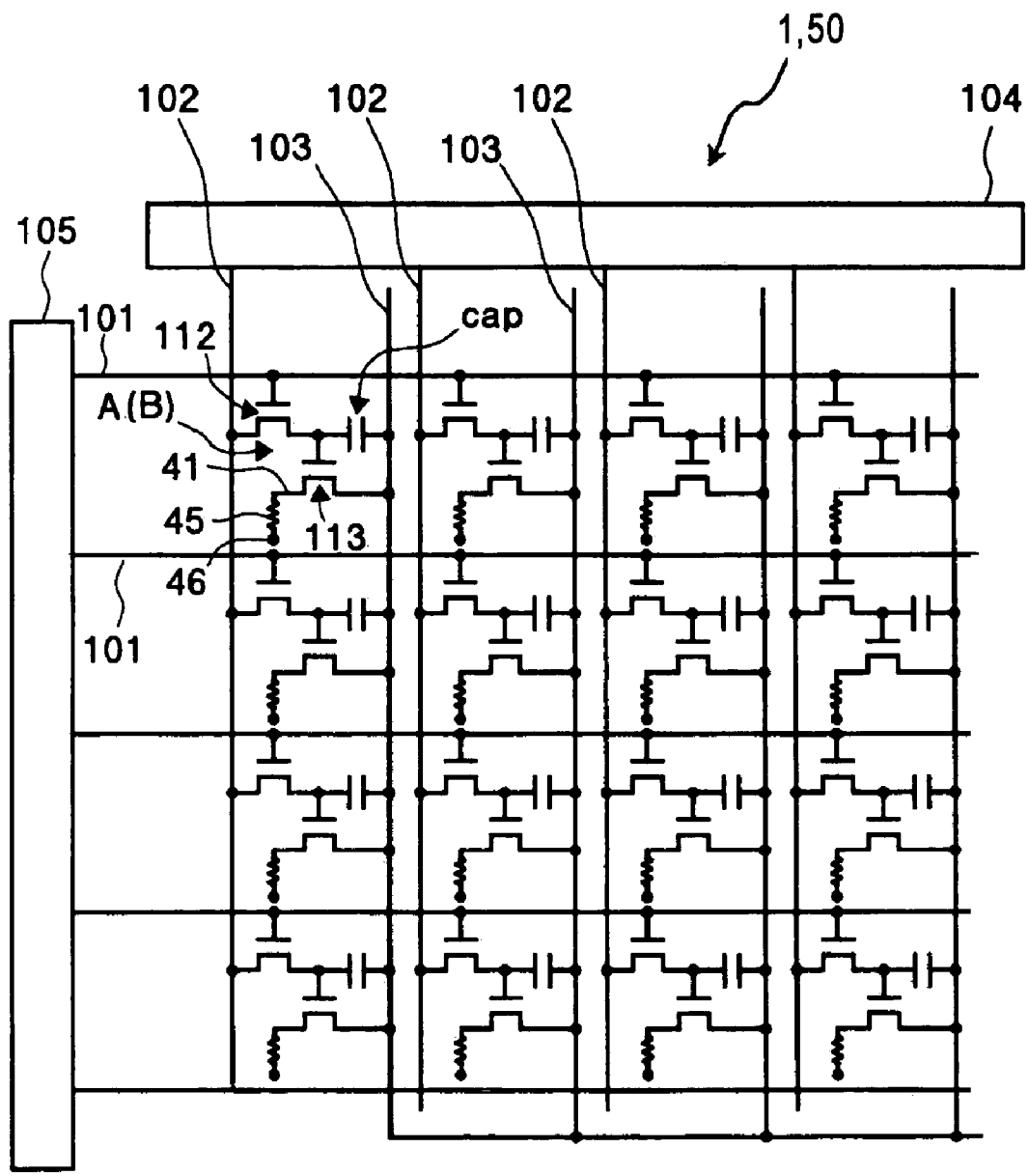
FIG. 1 is a plan view showing a wiring structure of an electro-optic device according to Example 1.

FIG. 1 is a schematic plan view of a wiring structure of an electro-optic device of this example. As shown in this figure, an electro-optic device 1 has the structure in which a plurality of scanning lines 101, a plurality of signal lines 102 which extend in a direction approximately perpendicular to the scanning lines 101 and which are placed at a certain distance therefrom, and a plurality of power lines 103 extending in a direction parallel to the signal lines 102 are provided. In addition, at individual intersecting positions between the scanning lines 101 and the signal lines 102, pixel regions A are provided in a matrix.

A data drive circuit 104 having a shift register, a level shifter, a video line, and an analog switch is connected to the signal lines 102. In addition, a scanning drive circuit 105 having a shift register and a level shifter is connected to the scanning lines 101.

In each pixel region A, there are provided a switching TFT 112 which is supplied with a scanning signal at its gate electrode through the scanning line 101, a capacitor cap which holds a pixel signal supplied from the signal line 102 through the switching TFT 112, a drive TFT 113 which is supplied with the pixel signal held by this capacitor cap at its gate electrode, a pixel electrode (anode) 41 into which a drive current is supplied from the power line 103 through this drive TFT 113, a counter electrode (cathode) 46 corresponding to this pixel electrode 41, and a functional layer 45 interposed therebetween. A light-emitting portion is formed of the pixel electrode 41, the counter electrode 46, and the functional layer 45. In addition, this functional layer 45 corresponds to an organic EL thin film containing a light-emitting layer, which will be described later.

In the electro-optic device 1 described above, when the switching TFT 112 is driven through the scanning line 101 into an ON state, a potential on the signal line 102 is held in the capacitor cap, and in accordance with the state of this capacitor cap, the ON or OFF state of the drive TFT 113 is determined. That is, since a current supplied from the power line 103 through the drive TFT 113 is changed in accordance with the state of the capacitor cap, the light brightness in a light-emitting element is changed in accordance with the current. As described above, the electro-optic device 1 can perform a desired display.

Figure 2:
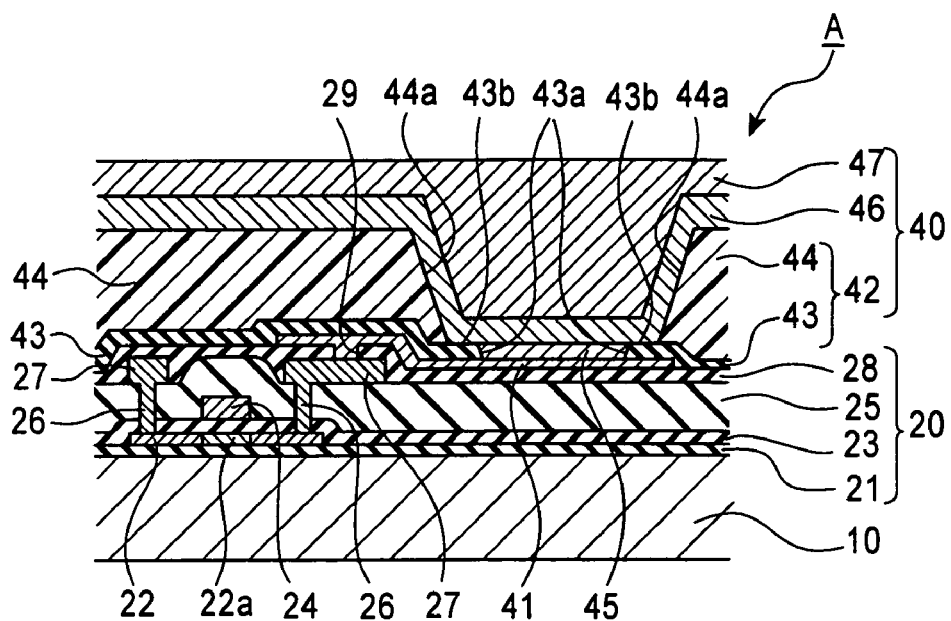
FIG. 2 is a cross-sectional view showing the structure of a pixel region of the electro-optic device shown in FIG. 1.
Figure 3:
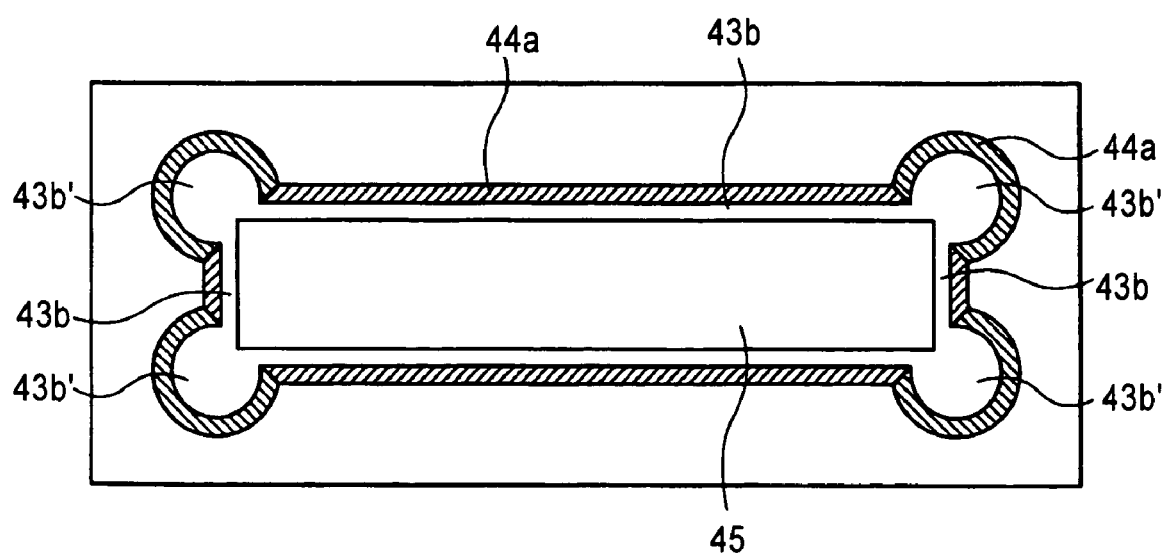
FIG. 3 is a plan view schematically showing one pixel in a pixel region.

FIGS. 2 and 3 are schematic views showing the structure of the pixel region A of the electro-optic device of this example, and FIG. 2 is a cross-sectional view showing more detailed structures of the functional layer 45 and the drive TFT 113 shown in FIG. 1. In addition, FIG. 3 is a plan view schematically showing one pixel of the pixel region A. As shown in FIG. 3, the pixel has an approximately long rectangular shape and has four corner portions along a peripheral portion thereof. As will be described later, a region surrounded by a first partition 43, which will be described later, is formed into a light-emitting region. In the present invention, the entire region surrounded by a partition 42 which will be described later is defined as one pixel. This electro-optic device 1 is composed of a substrate 10, drive element portions 20 in each of which active elements such as TFTs and wires are provided on the substrate 10, and functional element portions 40 in each of which an organic EL thin film is provided.

As materials for the substrate 10, various glass materials, resin materials, ceramic material including single crystals, and metal materials may be selectively used in accordance with applications. In FIG. 2, the case in which a glass substrate is used as the substrate is shown by way of example.

The drive element portion 20 is formed of the switching TFT 112, the drive TFT 113, other elements, and wires. The drive TFT 113 is formed of island-shaped polysilicon which is provided on a predetermined position on an underlayer 21 of SiO$_2$ or the like formed on the substrate 10. In FIG. 2, a vertical cross-sectional view of the drive TFT 113 taken in the vertical direction is shown. A gate electrode 24 of the drive TFT 113 is electrically connected to a drain electrode of the switching TFT 112 shown in FIG. 1. In addition, on a source region and a drain region of the drive TFT 113, a source electrode 27 and a drain electrode 27 are formed, respectively, through contact holes 26 provided in a first interlayer insulating film 23 and a second interlayer insulating film 25. One of the source electrode 27 and the drain electrode 27 is electrically connected to the power line 103 shown in FIG. 1, and the other electrode is electrically connected to the pixel electrode 41 of the functional element portion 40 through a contact hole 29 provided in a third interlayer insulating film 28. The first to the third interlayer insulating films 23, 25, and 28 of the drive element portion 20 are formed of an insulating material such as SiO$_2$.

The functional element portion 40 is formed of the functional layer 45 made of an organic EL thin film which is an organic compound layer including a light-emitting layer and a hole transport layer, the pair of electrodes (anode) 41 and (cathode) 46 for driving the functional layer 45, the partition 42 used for forming the functional layer 45 in a predetermined region, and a seal layer 47 for isolating the functional layer 45 from the ambient atmosphere.

The partition 42 is formed on the drive element portion 20 so as to surround a liquid-droplet filling region Rs in which the thin film-forming liquid material is filled for forming the functional layer 45, and the partition 42 is composed of the first partition 43 having a surface preferably lyophilic to the thin film-forming liquid material and the second partition 44 which is formed on the first partition 43 and which has a surface lyophobic to the thin film-forming liquid material. An upper portion of an opening of the first partition 43 is formed larger than a lower portion thereof. That is, a side surface of the first partition 43 is formed to have an inclined portion 43a inclined with respect to a direction perpendicular to the surface of the substrate. As is the case described above, an upper portion of an opening of the second partition 44 is formed larger than a lower portion thereof. That is, a side surface of the second partition 44 is also formed to have an inclined portion 44a inclined with respect to the direction perpendicular to the surface of the substrate.

In addition, the upper portion of the opening of the first partition 43 is located at a central side of the surface of the functional layer 45 as compared to the lower portion of the opening of the second partition 44. In other words, the second partition 44 is formed on the first partition 43 so that flat surfaces 43b and 43b' thereof are exposed when viewed from above. That is, as shown in FIG. 2, the cross-sectional shape of the first partition 43 and the second partition 44, both of which collectively form the partition 42, has a step structure.

In addition, at a peripheral portion of the opening of the first partition 43, that is, at a peripheral portion of the functional layer 45, the flat surfaces 43b and flat surfaces 43b' of the first partition 43 are provided, the flat surfaces 43b' are each formed in the vicinity of each corner portion of the functional layer 45 to have an approximately arc shape. The total area of the flat surfaces 43b' in the vicinity of the corner portions is formed larger than the total area of the flat surfaces 43b formed in the vicinity of the straight portions (long side portions and short side portions), and a large lyophilic area of the first partition 43 is ensured. The inclined portion 44a of the second partition 44 stands up along the peripheries of the flat surfaces 43b and 43b' of the first partition 43, and a flat surface is formed outside of an outer peripheral portion of the inclined portion 44a. An inclined angle of the second partition having an approximately arc shape formed at each of the corner portions of the first partition 43 is small as compared to that of the second partition 44 formed in the vicinity of each of the straight portions (long side portions and short side portions). In general, when the second partition is formed from a liquid containing an organic resin, the compression stress of a second partition-forming material applied to the arc portion is larger than that applied to the straight portion. Hence, the inclined angle of the second partition having the approximately arc shape is smaller than that of the second partition in the vicinity of the straight portion (each of the long side portions and the short side portions). Accordingly, the distance between the surface of the thin film-forming liquid material and a thin film-forming region surrounded by the first partition can be increased. As a result, the thin film-forming liquid material is prevented from gathering at a central portion of the opening which is caused by the surface tension.

The first partition 43 is formed of an insulating material which is lyophilic to the thin-film forming liquid material which will be described later, which has good adhesion to the underlying anode 41, and which can be easily patterned by photolithography. As a material as described above, for example, an inorganic material such as SiO$_2$ or TiO$_2$ may be used. In addition, the second partition 44 is formed of an insulating material which is lyophobic to the above liquid material, which has good adhesion to the underlying first partition 43, and which can be easily patterned by photolithography. As a material as described above, for example, an organic material such as polyimide resin or acrylic resin may be used.

The functional layer 45 is formed of a light-emitting layer 45b which emits light and a hole transport layer 45a which transports holes to the light-emitting layer but blocks the transportation of electrons therefrom. In this example, the case in which the functional layer 45 is formed of the light-emitting layer 45b and the hole transport layer 45a is described by way of example; however, in addition to the layers described above, as an auxiliary layer, a layer having a function of enhancing the light emission by the light-emitting layer, such as an electron injection layer, an electron transport layer, a hole block layer, an electron block layer, and a hole injection layer may also be provided.

As a light-emitting material forming the light-emitting layer 45b, a known light-emitting material which emits fluorescence or phosphorescence may be used. In particular, for example, polyfluorene derivatives (PF), poly(paraphenylene vinylene) derivatives (PPV), polyphenylene derivatives (PP), polyparaphenylene derivatives (PPP), polyvinylcarbazole (PVK), polythiophene derivatives, poly(dialkylfluorene) (PDAF), poly(fluorene-benzothiadiazole) (PFBT), poly(alkylthiophene) (PAT), and polysilane materials such as polymethylphenylsilane (PMPS) may be preferably used.

In addition, to the polymer materials mentioned above, polymer base materials, such as perylene base pigments, coumarin base pigments, and rhodamine base pigments, or low-molecular weight materials such as rublene, perylene, 9,10-diphenylanthracene, tetraphenylbutadiene, Neil Red, coumarin 6, quinacridone may be added as a doping material. The light-emitting layer 45b may be formed to emit monochromic light or may be formed to emit a plurality of colors such as red, blue, and green from respective pixels. In addition, the structure may also be formed to emit intermediate colors thereof. For example, the structure may be formed so as to emit six types of light having different colors from respective pixels as are inks used for a printer or the like.

As hole transport materials for forming the hole transport layer 45a, for example, polythiophene derivatives, polypyrrole derivative, and doped materials thereof may be used. In particular, 3,4-polyethylenedioxythiophene/polystyrenesulfonate (PEDOT/PSS) dispersion may be used, that is, a dispersion may be used which is formed by dispersing 3,4-polyethylenedioxythiophene in polystyrenesulfonate used as a dispersion medium, followed by further dispersing the dispersion thus formed in water.

By the use of the materials described above, the thickness of the entire functional layer 45 is formed approximately equivalent to that of the first partition 43. The thickness of the hole transport layer 45a is formed not more than that of the first partition 43. In addition, the light-emitting layer 45b is formed to have a uniform thickness over the entire region (opening region of the first partition 43) surrounded by the first partition 43. That is, since the thickness of the light-emitting layer 45b is not large in the vicinity of the central portion of the light-emitting region and is not small at the peripheral portion thereof, the light-emitting layer 45b is formed uniformly over the entire region.

The electrodes 41 and 46 are formed so as to sandwich the functional layer 45 in the vertical direction. Hereinafter, the electrode 41 formed at the substrate 10 side may be called a pixel electrode (anode) and the electrode 46 facing thereto may be called a counter electrode (cathode) in some cases.

When the electro-optic device 1 is a top emission type device in which light emission is performed at the functional layer 45 side, the counter electrode (cathode) 46 is formed of a transparent conductive material such as indium tin oxide (hereinafter referred to as "ITO"), and the pixel electrode (anode) 41 is formed of a metal material which is ordinarily used for electrodes. In addition, a light-transmitting material such as ITO may also be used. Furthermore, the thickness of the electrode material mentioned above may be decreased so as to obtain light transmitting properties.

In addition, when the electro-optic device 1 is a bottom emission type device in which light emission is performed at the substrate 10 side, the pixel electrode (anode) 41 is formed of a transparent conductive material, and the counter electrode (cathode) 46 is formed of an opaque metal material which is ordinarily used for electrodes. For example, elemental substances, such as aluminum (Al), magnesium (Mg), lithium (Li), and calcium (Ca), and alloys such as an Mg—Ag alloy at a ratio of 10 to 1 may be used. In addition, a two-layered structure or a three-layered electrode structure may be formed using the above-mentioned materials. In particular, a metal composite film made of two layers of Li$_2$O (thickness of approximately 0.5 nm) and Al (thickness of approximately 200 nm), a metal composite film made of two layers of LiF (thickness of approximately 0.5 nm) and Al (thickness of approximately 200 nm), a metal composite film made of two layers of MgF$_2$ (thickness of approximately 0.5 nm) and Al (thickness of approximately 200 nm), and the like may be used.

Furthermore, when light emission of the electro-optic device 1 is performed at the two sides of the substrate 10, the pixel electrode (anode) 41 and the counter electrode (cathode) 46 may both be formed of a transparent conductive material.

The seal layer 47 is a layer formed on the cathode 46 so as to prevent the functional layer 45 from being brought into with moisture, oxygen, and the like in the air, and a can for casing or a sealing film having a gas barrier properties may be provided on the organic EL element. As sealing materials as described above, various resin materials may be used.

In the electro-optic device 1 having the structure as described above, the thickness of the functional layer 45 is uniform in the entire region surrounded by the first partition 43, and hence unevenness and variation in light brightness caused by variation in thickness of the light-emitting layer 45b may not occur. Accordingly, a high-quality electro-optic device can be realized by the present invention.

<Methods for Manufacturing Electro-Optic Device, Semiconductor Device, and Electro-Optic Device Substrate>

Figure 4:
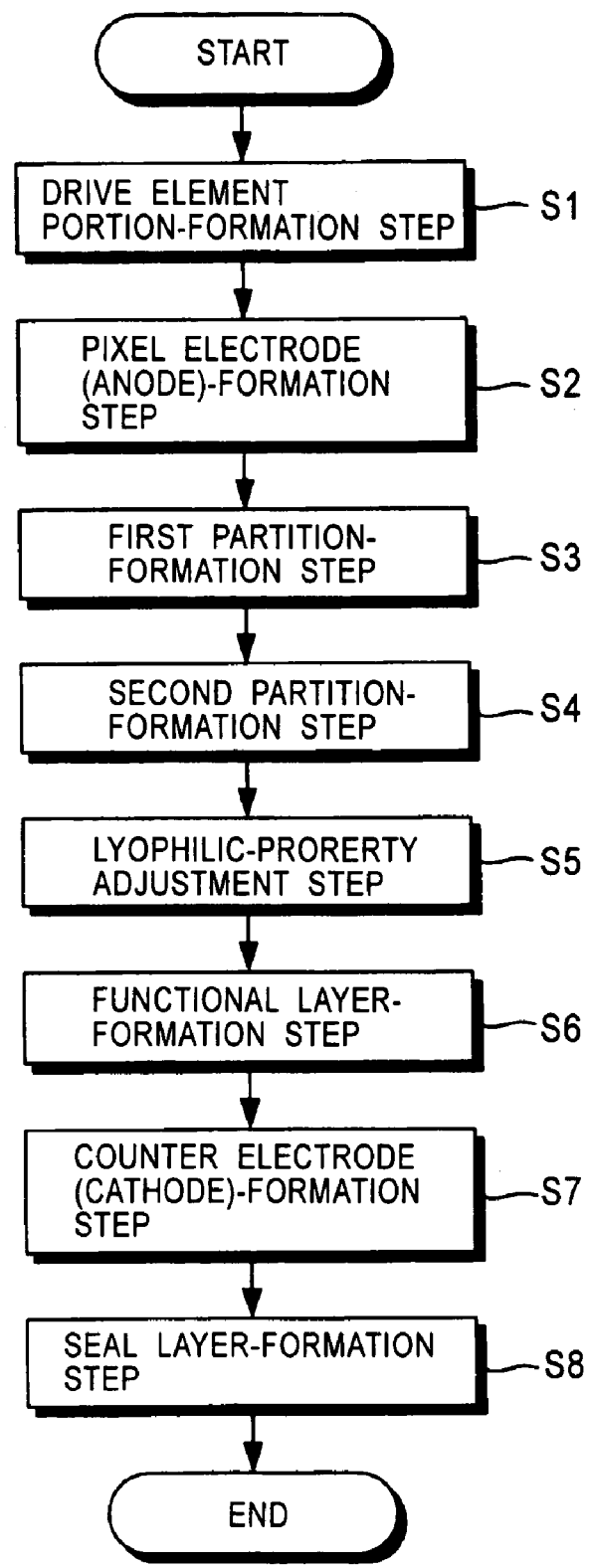
FIG. 4 is a flowchart showing a process for manufacturing an electro-optic device.

Next, a method for manufacturing the electro-optic device of the present invention will be described. FIG. 4 is a flowchart showing a process for manufacturing the electro-optic device 1 of this example, and FIGS. 5A to 5L are cross-sectional views schematically showing manufacturing steps. As shown in FIG. 4, this method for manufacturing an electro-optic device 1 includes a drive element portion-formation step (S1), a pixel electrode (anode)-formation step (S2), a first partition-formation step (S3), a second partition-formation step (S4), a lyophilic-property adjustment step (S5), a functional layer-formation step (S6), a counter electrode (cathode)-formation step (S7), and a seal layer-formation step (S8).

Figure 5A:
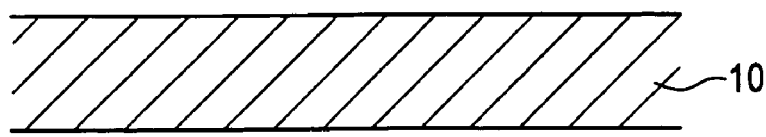
FIG. 5A is a cross-sectional view showing a step of manufacturing an electro-optic device.
Figure 5B:
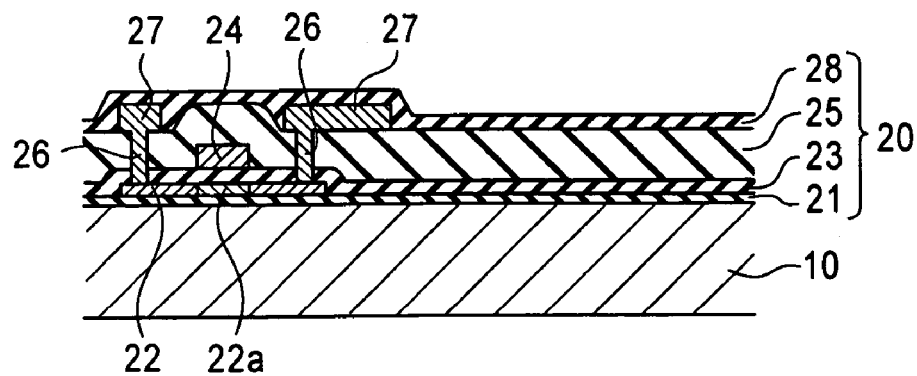
FIG. 5B is a cross-sectional view showing a step of manufacturing an electro-optic device.

First, in the drive element portion-formation step (S1), as shown in FIGS. 5A and 5B, wires such as the scanning line 101 and the signal lines 102, and active elements such as the switching TFTs 112 and the drive TFTs 113 are formed on the substrate 10. For example, when the drive TFT 113 is formed as shown in FIG. 5B, the underlayer 21 is first formed using $SiO_2$ on the substrate 10, and an amorphous silicon film is then formed on the underlayer 21 using film-formation means such as plasma CVD (chemical vapor deposition). Next, the amorphous silicon film is melted, cooled, and solidified by laser annealing to form a polysilicon film. Subsequently, etching is performed so as to allow only a polysilicon film 22 used for the drive TFT 113 to remain on the substrate 10.

In addition, after the first interlayer insulating film 23 is formed so as to cover the surfaces of the polysilicon film 22 and the underlayer 21, an n-channel 22a is formed in the polysilicon film 22 at an approximately central portion thereof by implanting $N^+$ ions, and the gate electrode 24 is formed on the first interlayer insulating film 23 at a position approximately corresponding to the n-channel 22a. Next, after the second interlayer insulating film 25 is formed so as to cover the surfaces of the gate electrode 24 and the first interlayer insulating film 23, two contact holes 26 are formed at two sides of the gate electrode 24 so as to extend to the polysilicon film 22 through the first interlayer insulating film 23 and the second interlayer insulating film 25. Subsequently, after the source and the drain electrodes 27 are formed in the contact holes and in the vicinity thereof, the third interlayer insulating film 28 is formed so as to cover the surfaces of the source and the drain electrodes 27 and the surface of the second interlayer insulating film 25. As described above, the drive element portion 20 is formed.

Figure 5C:
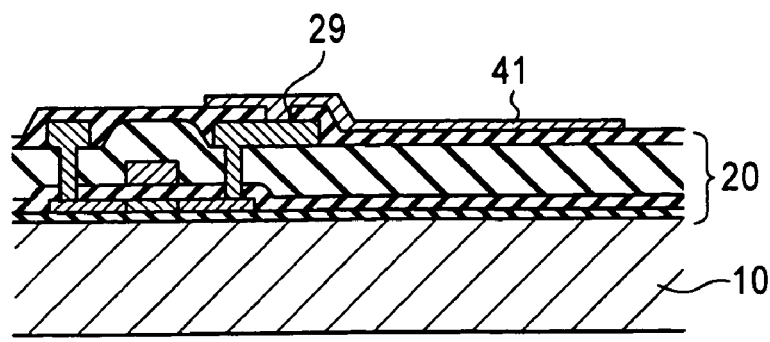
FIG. 5C is a cross-sectional view showing a step of manufacturing an electro-optic device.

Next, in the pixel electrode (anode)-formation step (S2), the contact hole 29 is formed to extend to one of the source and the drain electrodes 27 as shown in FIG. 5C, and on the drive element portion 20, a conductive material film to be formed into the pixel electrode (anode) 41 is deposited by sputtering, deposition, or another film-formation means. This thin film for electrode is preferably formed using a material lyophilic to a thin film material, which will be described later. Hence, the thin film for electrode may have a good affinity for the surface of a composition to be filled by an ink-jet process which will be described later. Accordingly, when being supplied, a liquid material containing the above composition uniformly and reliably wets the surface of the pixel electrode (anode) 41 and then spreads thereon, and as a result, a superior thin film can be formed.

Subsequently, by using a photolithographic and etching process, the conductive thin film thus formed as shown in FIG. 5C is patterned into a pixel electrode shape, thereby forming the pixel electrode (anode) 41. In this step, since the conductive material is filled in the contact hole 29 formed in the third interlayer insulating film 28, the pixel electrode (anode) 41 of the functional element portion 40 and an electrode terminal of the drive TFT 113 are electrically connected to each other through the contact hole 29.

Figure 5D:
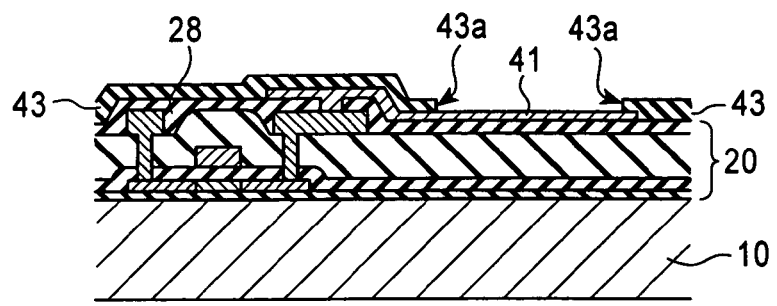
FIG. 5D is a cross-sectional view showing a step of manufacturing an electro-optic device.
Figure 5E:
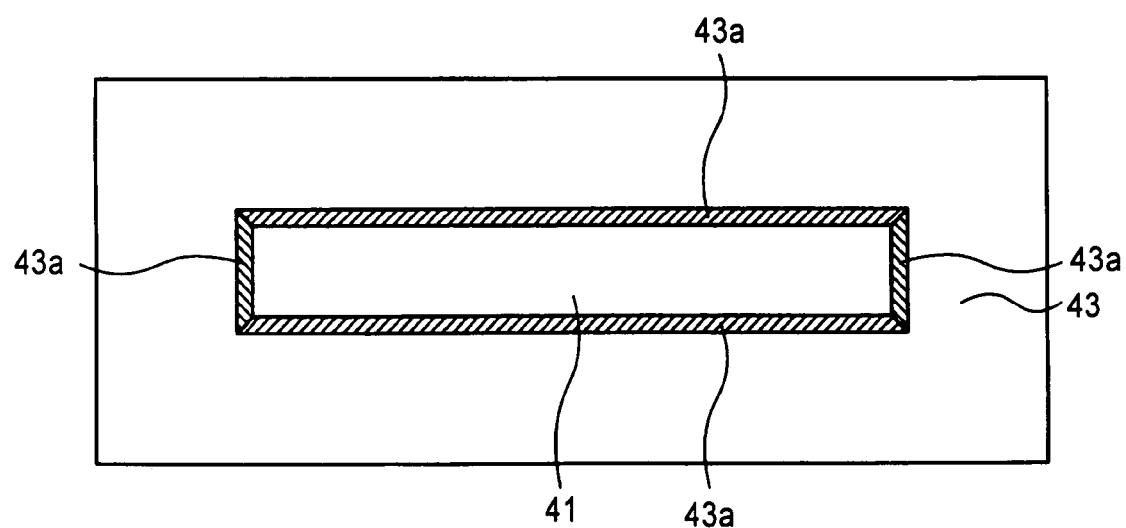
FIG. 5E is a cross-sectional view showing a step of manufacturing an electro-optic device.

Then, in the first partition-formation step (S3), a thin film such as a $SiO_2$ film to be formed into the first partition 43 is formed on the pixel electrode (anode) 41 thus patterned and the third interlayer insulating film 28. Subsequently, as shown in FIGS. 5D and 5E, a part of this $SiO_2$ film located at a predetermined position on the pixel electrode (anode) 41 is removed by etching, thereby forming the opening in which the functional layer 45 is to be formed. That is, the first partition 43 is allowed to remain along the peripheral portion of the pixel electrode (anode) 41 so as to surround a region for forming the functional layer 45. In this example, the opening in which the functional layer 45 is to be formed has a long rectangular shape as shown in FIG. 5E, and at the peripheral portion thereof, four corner portions are present. In addition, the upper portion of the opening of the first partition 43 is formed larger than the lower portion thereof. That is, the side surface of the first partition 43 is formed to have the inclined portion 43a inclined with respect to the direction perpendicular to the surface of the substrate as shown in FIG. 5D.

Figure 5F:
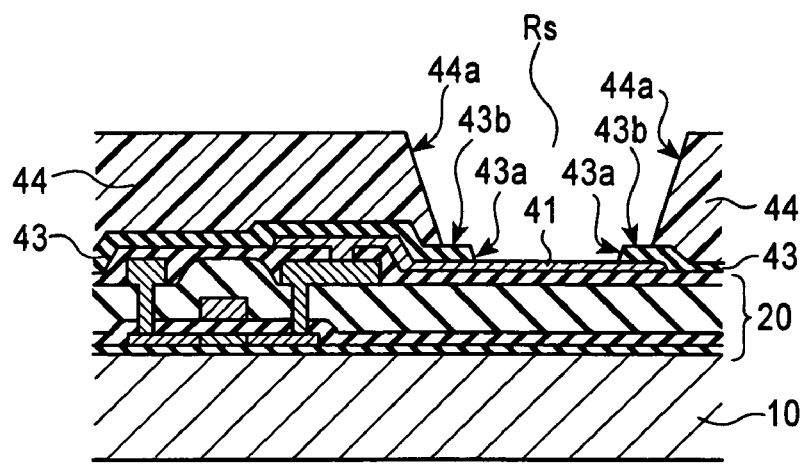
FIG. 5F is a cross-sectional view showing a step of manufacturing an electro-optic device.
Figure 5G:
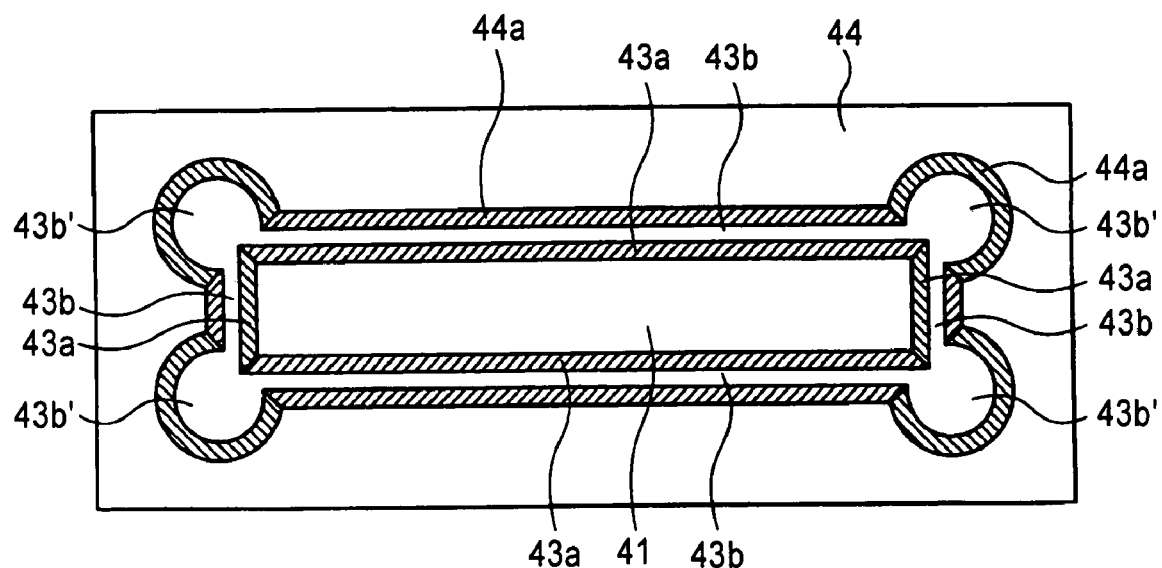
FIG. 5G is a cross-sectional view showing a step of manufacturing an electro-optic device.

Next, in the second partition-formation step (S4), an insulating organic material having a photosensitivity is applied onto the first partition 43 and the pixel electrode (anode) 41 and is then irradiated with ultraviolet rays through a mask, followed by development, thereby forming the second partition 44 as shown in FIGS. 5F and 5G In this step, the upper portion of the opening of the second partition 44 is formed larger than the lower portion thereof.

That is, the side surface of the second partition 44 is formed to have the inclined portion 44a inclined with respect to the direction perpendicular to the surface of the substrate. Accordingly, as shown in FIG. 5F, the partition 42 formed of the first partition 43 and the second partition 44 has a step structure. The thickness of the second partition 44 is not particularly limited and may be determined in consideration of the amount of the composition to be filled in the functional layer-formation step, an electrical parasitic capacitance generated between the second partition 44 and the circuit substrate, and the like.

In addition, the second partition 44 is formed on the first partition 43 so that the flat surfaces 43b and 43b' are exposed when viewed from above, and the flat surfaces 43b' in the vicinity of the corner portions of the opening of the first partition 43, that is, in the vicinity of the corner portions of the functional layer 45, are each formed so as to have an arc shape. By the step described above, the areas of the flat surfaces 43b' of the first partition 43 in the vicinity of the corner portions of the opening are larger than the areas of the flat surfaces 43b in the vicinity of the straight portions (long side portions and the short side portions) of the opening, and hence the area of the lyophilic first partition 43 can be increased.

Next, in the lyophilic-property adjustment step (S5), treatment for adjusting the degree of a lyophilic property of the surfaces of the pixel electrode (anode) 41, the first partition 43, and the second partition 44 is performed. That is, treatment is performed for the pixel electrode (anode) 41 and the first partition 43 is performed so as to improve the lyophilic property thereof to the thin film-forming liquid material is performed, and for the second partition 44, treatment is performed for degrading the lyophilic property to the thin film-forming liquid, in other words, for enhancing the lyophobic property thereto. For example, the surfaces of the pixel electrode (anode) 41 and the first partition 43 are processed by oxygen plasma treatment, UV radiation treatment, or exposure treatment to a gas containing ozone. By improving the lyophilic property to the thin film-forming liquid material as described above, the surfaces of the pixel electrode (anode) 41 and the first partition 43 are able to have improved wettability to the thin film-forming liquid material and may also have a superior affinity for the composition of the thin film-forming liquid material to be filled by an ink-jet process which will be described later.

Accordingly, when being filled, the thin film-forming liquid material easily wets the surface of the pixel electrode (anode) 41 and uniformly spreads thereon.

In addition, fluorine plasma treatment using a gas such as $CF_4$, $SF_6$, or $CHF_3$ is performed for the surface of the second partition 44 to enable it to have a lyophobic property. Accordingly, when drying is performed, the thin film-forming liquid material filled by an ink-jet process, which will be described later, tends to be easily separated from the second partition 44, and hence the thin film can be formed without any liquid material remaining on the surface of the second partition 44. When the pixel electrode (anode) 41 and the first partition 43 are formed of a material which is sufficiently lyophilic to the thin film-forming liquid material, this lyophilic-property adjustment step is not necessarily performed. In addition, as is the above case, when the second partition 44 is formed of a material which is sufficiently lyophobic to the thin film-forming liquid material, this lyophilic-property adjustment step is also not necessarily performed.

Figure 5H:
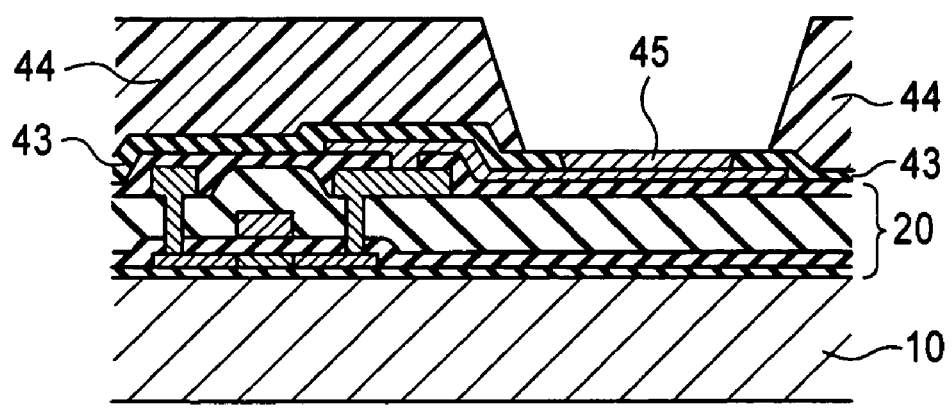
FIG. 5H is a cross-sectional view showing a step of manufacturing an electro-optic device.
Figure 5I:
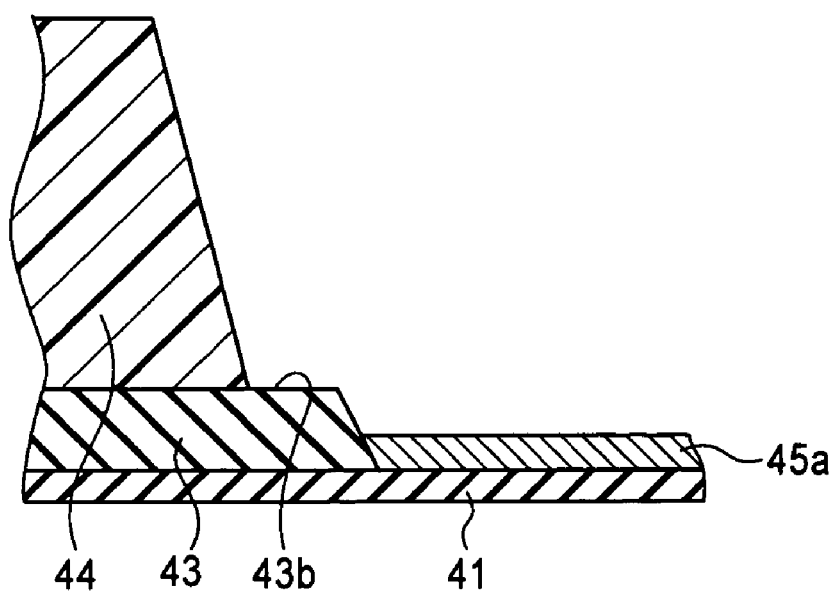
FIG. 5I is a cross-sectional view showing a step of manufacturing an electro-optic device.

Next, in the functional layer-formation step (S6), by a liquid-droplet discharge method using ink-jetting, the functional layer 45 made of the light-emitting layer 45b and the hole transport layer 45a is formed as shown in FIG. 5H. In this step, a thin film-forming liquid material forming the hole transport layer 45a is filled in the liquid-droplet filling region Rs, followed by drying, thereby forming the hole transport layer 45a shown in FIG. 5I. In this formation, the amount of the thin film-forming liquid material is adjusted so that the thickness of the hole transport layer 45a obtained after drying is not more than that of the first partition 43.

Figure 5J:
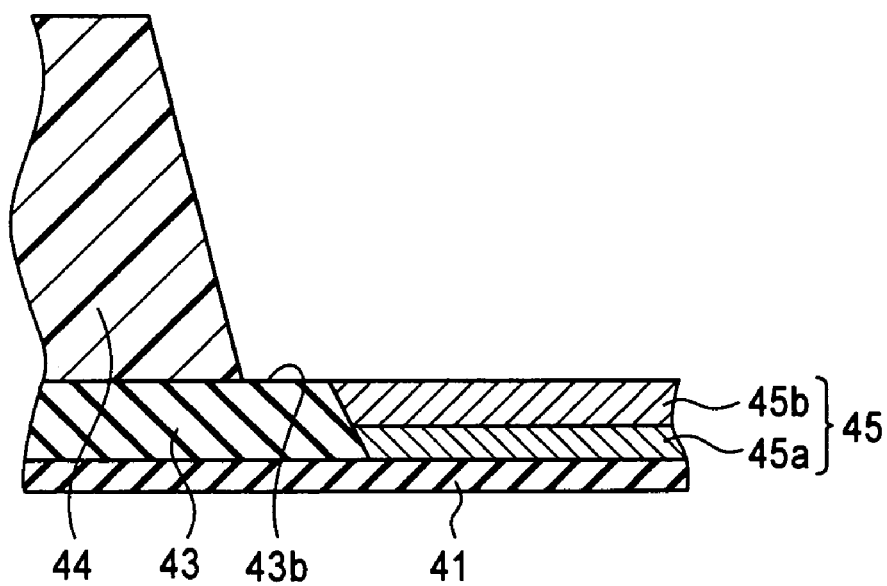
FIG. 5J is a cross-sectional view showing a step of manufacturing an electro-optic device.

Next, a thin film-forming liquid material containing a material composition for forming the light-emitting layer 45b is filled in the liquid-droplet filling region Rs, followed by drying, thereby forming the light-emitting layer 45b as shown in FIG. 5J. In this step, as is the case described above, the amount of the thin film-forming liquid material is adjusted so that the thickness of the functional layer 45 obtained after drying is approximately equivalent to that of the first partition 43.

In the present invention, as described above, among the flat surfaces of the first partition 43 which are exposed through the second partition 44, the flat surfaces 43b' in the vicinity of the corner portions of the opening of the first partition 43, that is, in the vicinity of the corner portions of the functional layer 45, are each formed to have an approximately arc shape so that the total area thereof is larger than that of the first partition 43 in the vicinity of the straight portions (long side portions and short side portions) of the opening. Hence, by the presence of the approximately arc-shaped flat surfaces 43b' of the first partition having large areas, the liquid material for forming the light-emitting layer is dried while being strongly pulled toward the peripheral side of the opening, and hence the thin film-forming liquid material is prevented from gathering at the central portion of the opening.

In general, when a thin film in a liquid phase is changed into a solid phase, the compression stress is applied to the liquid. The compression stress applied to an arc portion is larger than that applied to a straight portion. Accordingly, a large compression stress is applied to the thin film-forming liquid material at the flat surface 43b' having an approximately arc shape located in the vicinity of the corner portion of the opening as compared to that in the vicinity of the straight portion (long side portion or short side portion) of the opening, and a taper angle of a periphery of a liquid droplet of the thin film-forming liquid is decreased. As the taper angle is decreased, the liquid material tends to widely wet the surface of the region and spread thereon, and hence the thin film-forming liquid material is prevented from gathering at the central portion of the opening which is caused by the surface tension.

As a result, the light-emitting layer 45b is formed uniformly over the entire region (opening region of the first partition 43) surrounded by the first partition 43, and the generation of unevenness and variation in light brightness within one pixel can be prevented which is caused by the variation in film thickness of the light-emitting layer 45b.

As described above, the hole transport layer 45a and the light-emitting layer 45b are formed on the pixel electrode (anode) 41 in that order from the bottom, and hence the functional layer 45 having a thickness approximately equivalent to that of the first partition 43 is formed. When a plurality of auxiliary layers is formed, by filling thin film-forming liquid materials each containing a composition forming a desired auxiliary layer in the liquid drop-filling region Rs, followed by drying, the functional layer 45 is formed so as to have a plurality of auxiliary layers.

Figure 5K:
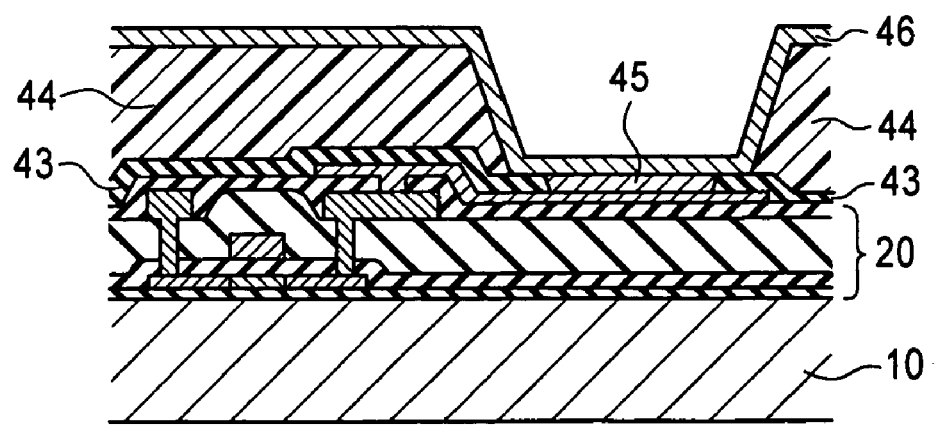
FIG. 5K is a cross-sectional view showing a step of manufacturing an electro-optic device.

Next, in the counter electrode (cathode)-formation step (S7), a thin film to be formed into the counter electrode (cathode) is formed on the functional layer 45 by deposition, sputtering, or another film-forming means and is then patterned into a desired shape (counter cathode shape), thereby forming the counter electrode (cathode) 46 as shown in FIG. 5K. The counter electrode (cathode) 46 may be formed of an elemental substrate such as aluminum (Al), magnesium (Mg), lithium (Li), or calcium (Ca), or an alloy material such as an Mg—Ag alloy at a ratio of 10 to 1. In addition, the counter electrode (cathode) 46 may be formed of one metal layer or may be formed of two to three layers of the materials mentioned above.

Figure 5L:
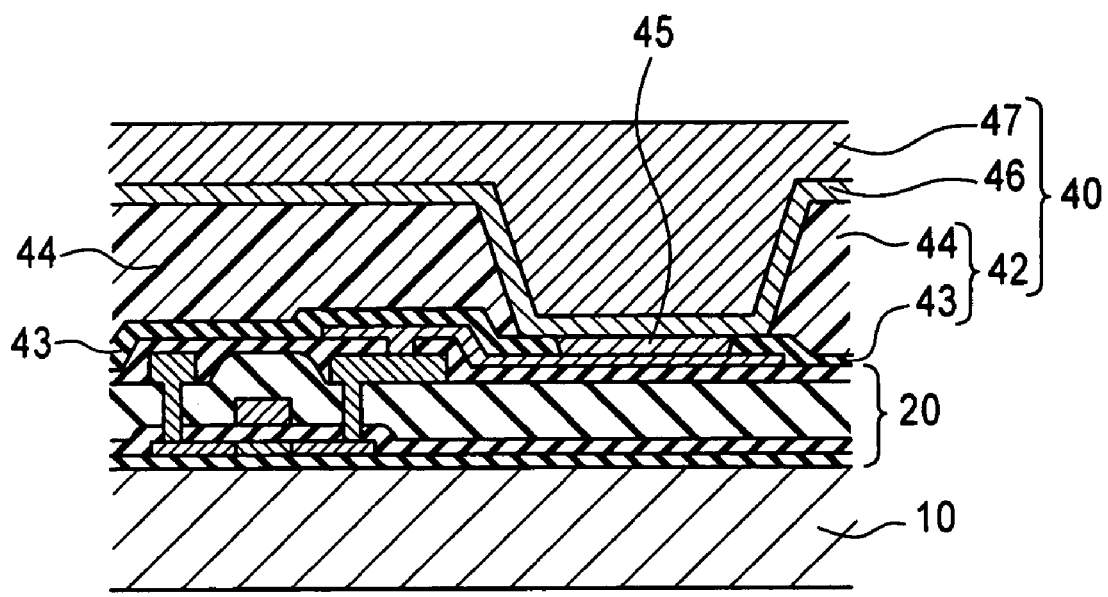
FIG. 5L is a cross-sectional view showing a step of manufacturing an electro-optic device.

In the seal layer-formation step (S8), as shown in FIG. 5L, the seal layer 47 is formed over the surface of the substrate 10 on which the functional layer 45 is formed. This seal layer 47 serves to prevent the functional layer 45 and the electrode materials from being degraded by moisture and oxygen in the air which come into contact therewith. As materials for the seal layer 47, various resin materials such as thermosetting epoxy resin and UV curable epoxy resin may be used.

According to the method for manufacturing an electro-optic device, described above, by performing steps S1 to S8 described above, the electro-optic device 1 shown in FIGS. 2 and 3 can be formed, and the light-emitting layer 45b (functional layer 45) having a uniform thickness can be easily and reliably formed in the entire region surrounded by the partition. Hence, a high quality electro-optic device can be manufactured in which the quality is not degraded by the variation in film thickness of the light-emitting layer 45b (functional layer 45).

The drive element portion 20 and part of the functional element portion 40 (pixel electrode (anode) 41 and the partition 42) are formed on the substrate 10 from the steps S1 to S5 (or S4) and are collectively called an electro-optic device substrate in this specification.

EXAMPLE 1-2

Figure 6:
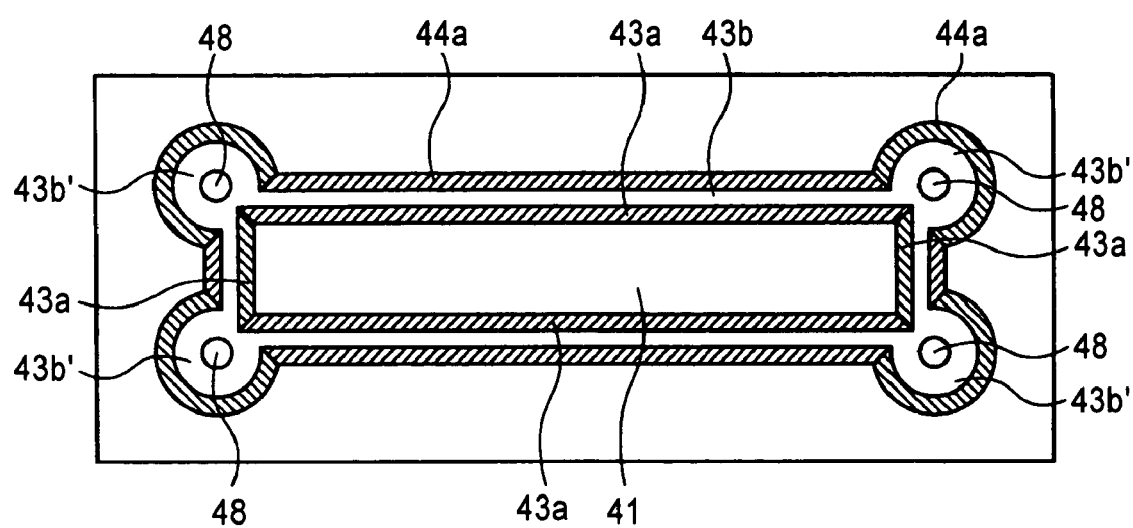
FIG. 6 is a plan view showing another example of the structure of a pixel region of an electro-optic device.

In addition, as one modification of the above example, the present invention may also provide the following structure shown in FIG. 6. As shown in FIG. 6, in the pixel structure shown in FIG. 3, concave portions 48 used as a liquid pool are formed in the flat surfaces 43b' having an approximately arc shape formed in the vicinity of the corner portions of the opening of the first partition 43, that is, in the vicinity of the corner portions of the functional layer 45. Since the concave portions 48 are formed in the flat surfaces 43b' of the first partition 43 each having an approximately arc shape, when being dried, the thin film-forming liquid material remains in the concave portions 48 formed in the flat surfaces 43b' of the first partition 43 and hence is pulled to the flat surfaces 43b' of the first partition 43 each having an approximately arc shape. Accordingly, the thin film-forming liquid material is dried while being more strongly pulled to the corner portions each having an approximately arc shape, that is, the thin film-forming liquid material is dried while being prevented from gathering at the central portion of the opening which is caused by the surface tension. As a result, in the entire region (region of the opening of the first partition 43) surrounded by the first partition 43, the light-emitting layer 45b can be formed so as to have a uniform film thickness.

Accordingly, the generation of uneven light brightness within one pixel due to the variation in thickness of the light-emitting layer 45b can be reliably prevented, and hence a high quality electro-optic device can be formed.

Figure 7:
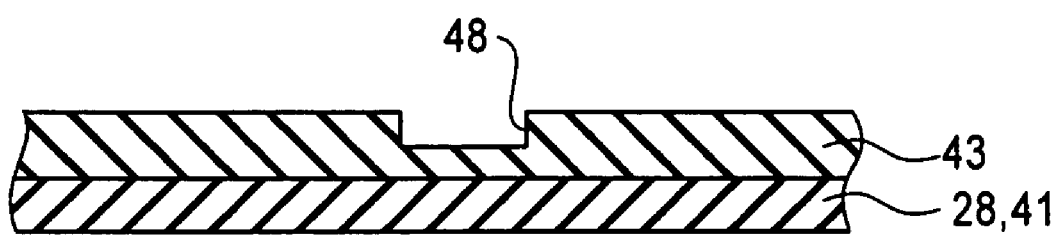
FIG. 7 is a cross-sectional view showing one example of a concave shape.
Figure 8:
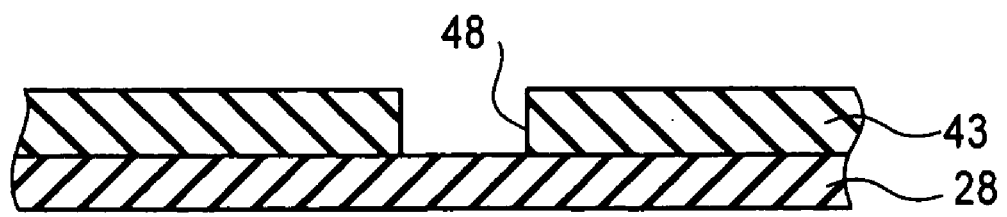
FIG. 8 is a cross-sectional view showing one example of a concave shape.

The shape of the concave portion 48 is not particularly limited, and various shapes such as a cylindrical, a rectangular columnar, and a dimple shape may be optionally used. In addition, the depth of the concave portion 48 is not particularly limited and may be optionally determined in accordance with various conditions, such as the area of the flat surface 43b' of the first partition 43 having an approximately arc shape and the amount of the thin film-forming liquid material filled in the liquid-droplet filling region Rs. That is, the depth of the concave portion 48 may extend halfway into the first partition 43 along the thickness direction as shown in FIG. 7 or may penetrate the first partition 43 along the thickness direction as shown in FIG. 8. However, in this case, the pixel electrode (anode) 41 should not be provided under the first partition 43. The reason for this is as follows. That is, when the concave portion 48 is formed to penetrate the first partition 43 in the thickness direction, since the functional layer 45 is formed in the concave portions 48, and the counter electrode (cathode) 46 is formed on the functional layer 45, light may also be emitted in the concave portion 48 in some cases, resulting in unevenness of light brightness.

EXAMPLE 1-3

Figure 9:
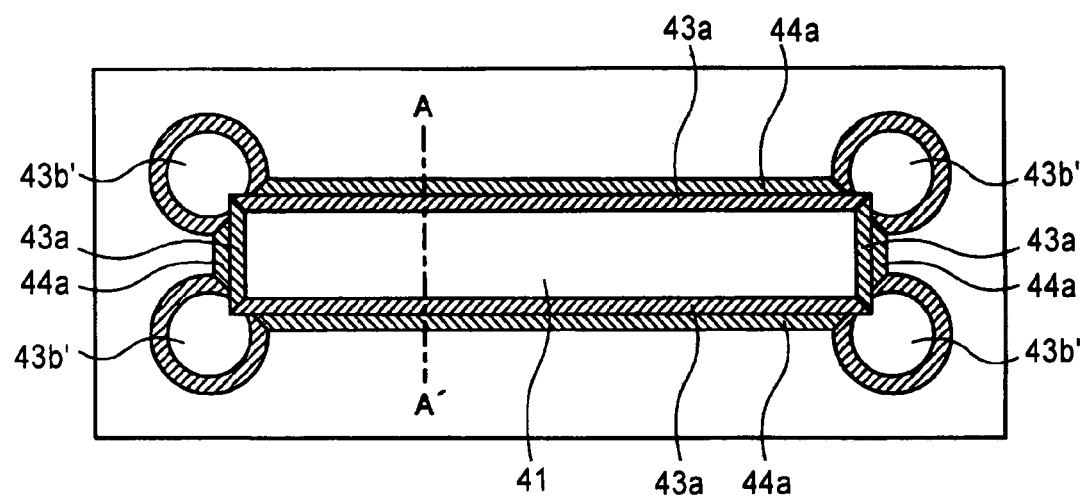
FIG. 9 is a plan view showing another example of the structure of a pixel region of an electro-optic device.
Figure 10:
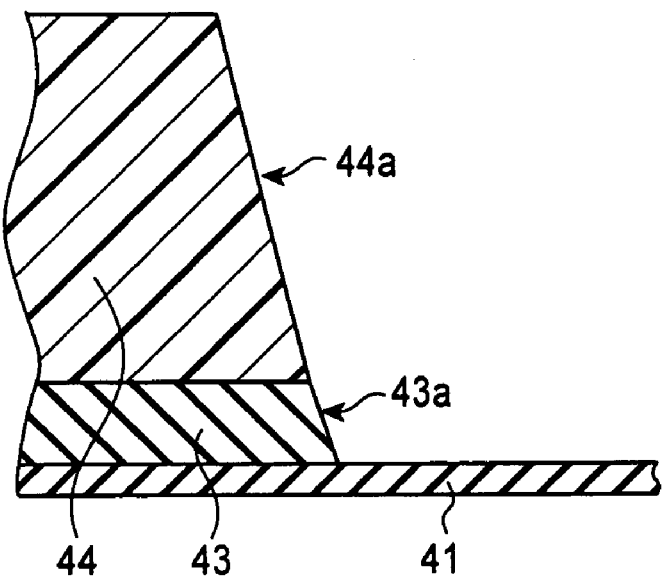
FIG. 10 is a cross-sectional view of an important portion taken along the line A-A' shown in FIG. 10.

In addition, as another modification of the above example, the following structure as shown in FIG. 9 may also be provided. As shown in FIG. 9, in the structure of the pixel shown in FIG. 3, the flat surfaces 43b of the first partition 43 are not formed along the short side and the long side directions of the pixel electrode (anode) 41 having an approximately rectangular shape, and the flat surfaces 43b' of the first partition 43 each having an approximately arc shape are only formed in the vicinity of the corner portions of the pixel electrode (anode) 41. The cross-sectional shape taken along the line A-A' in FIG. 9 is as shown in FIG. 10, and the inclined portion 43a of the first partition 43 and the inclined portion 44a of the second partition 44 form a continuous side surface without having the flat surfaces 43b of the first partition 43. In FIG. 9, in order to facilitate understanding of this modification of the example, the state in which the counter electrode (cathode) 46 and the seal layer 47 are not formed is shown, that is, the state of the electro-optic device substrate is shown. In the cross-sectional shape taken along the line A-A' in FIG. 9, the inclined portion 43a and 44a of the first partition 43 and the second partition 44, respectively, are shown in FIG. 10.

As described above, since the flat surfaces 43b' of the first partition 43 each having an approximately arc shape are only formed in the vicinity of the corner portions of the pixel electrode (anode) 41, when being dried, the thin film-forming liquid material is not pulled to the peripheral side in the vicinity of the straight portions (short side and long side portions) of the opening but is pulled to the flat surface 43b' of the first partition 43 each having an approximately arc shape. Accordingly, the thin film-forming liquid material is prevented from gathering at the central portion of the opening which is caused by the surface tension. As a result, the light-emitting layer 45b can be formed to have a uniform film thickness in the entire region (region of the opening of the first partition 43) surrounded by the first partition 43.

Accordingly, the light-emitting layer 45b can be more reliably formed to have a uniform thickness on the whole; hence, a high quality electro-optic device can be formed in which the generation of uneven light brightness within one pixel will not occur due to the variation in thickness of the light-emitting layer 45b.

EXAMPLE 2-1

<Electro-Optic Device>

Figure 11:
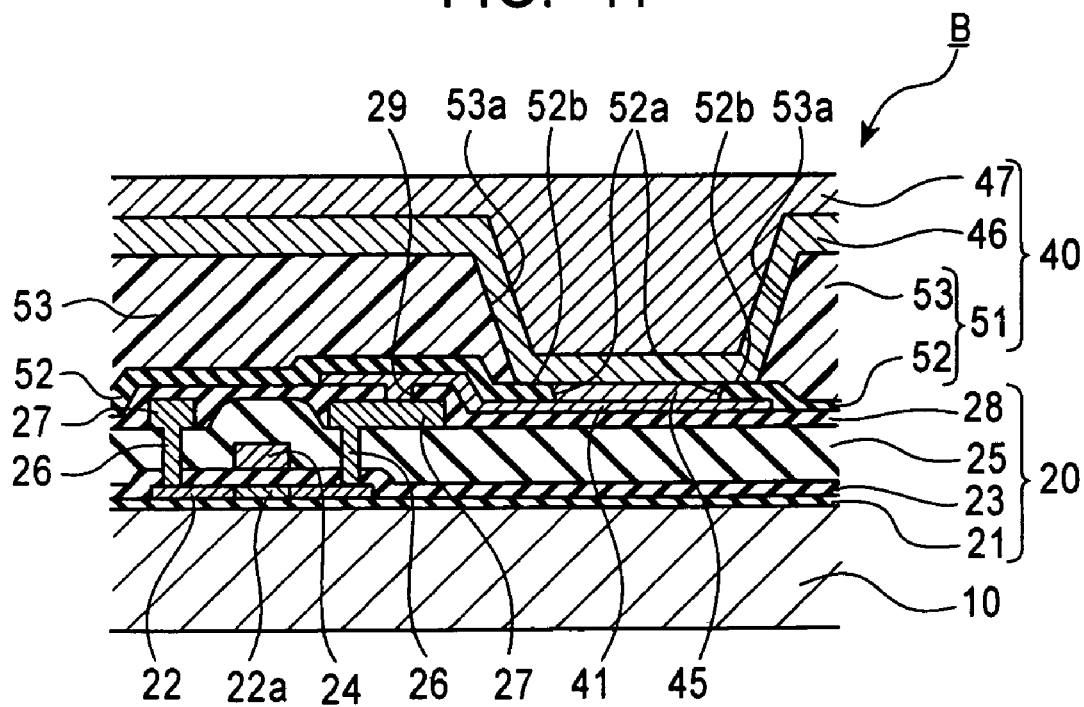
FIG. 11 is a cross-sectional view showing the structure of a pixel region of an electro-optic device according to Example 2.
Figure 12:
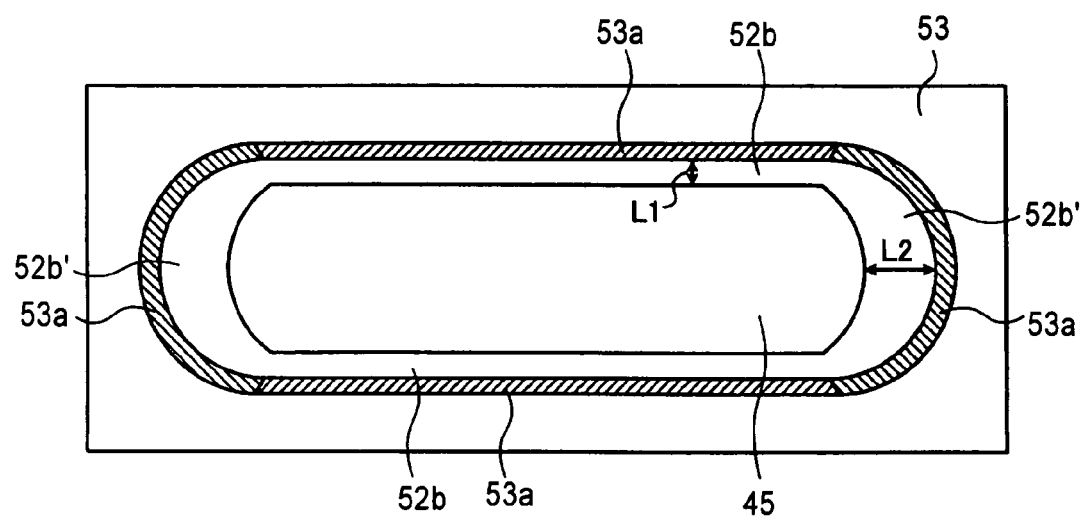
FIG. 12 is a plan view schematically showing one pixel in a pixel region.

FIGS. 11 and 12 are schematic views showing the structure of a pixel region B (shown in FIG. 1) of the electro-optic device 1 according to this example, and FIG. 11 is a cross-sectional view showing a more detailed structure of a portion including the functional layer 45 and the drive TFT 113 shown in FIG. 1. In addition, FIG. 12 is a plan view schematically showing one pixel in the pixel region B. As shown in FIG. 12, the pixel has a long shape and also has arc shapes at two ends thereof in the longitudinal direction. In addition, an area surrounded by a first partition 52, which will be described later, is to be used as the light-emitting region. This electro-optic device 1 is composed of the substrate 10, the drive element portions 20 in each of which active elements such as TFTs and wires are formed on the substrate 10, and the functional element portions 40 in each of which an organic EL thin film is formed.

The functional element portion 40 comprises the functional layer 45 composed of the light-emitting layer and a hole transport layer, a pair of the electrodes 41 (anode) and 46 (cathode) for operating the functional layer 45, a partition 51 used for forming the functional layer 45 in a predetermined region, and the seal layer 47 for isolating the functional layer 45 from the ambient atmosphere.

The partition 51 forms the liquid-droplet filling region Rs used when the functional layer 45 is formed, and the surface of the partition 51 is formed of the first partition 52 having a surface preferably lyophilic to a thin film-forming liquid material and a second partition 53 which is formed on the first partition 52 and which has a surface lyophobic to the thin film-forming liquid material. An upper portion of an opening of the first partition 52 is formed larger than a lower portion thereof. That is, a side surface of the first partition 52 is formed to have an inclined portion 52a with respect to a direction perpendicular to the surface of the substrate. As is the case described above, an upper portion of an opening of the second partition 53 is formed larger than a lower portion thereof. That is, a side surface of the second partition 53 is also formed to have an inclined portion 53a with respect to the direction perpendicular to the surface of the substrate.

In addition, the upper portion of the opening of the first partition 52 is located at the central side of the surface of the functional layer 45 as compared to the lower portion of the opening of the second partition 53. In other words, the second partition 53 is formed on the first partition 52 so that flat surfaces 52b thereof are exposed when viewed from above. That is, as shown in FIG. 11, the cross-sectional shape of the first partition 52 and the second partition 53, which collectively form the partition 51, has a step structure.

In addition, at a peripheral portion of an opening of the first partition 52, that is, at the peripheral portion of the functional layer 45, the first partition 52 has the flat surfaces 52b and flat surfaces 52b', and the flat surfaces 52b' formed at two ends of the opening in the longitudinal direction each have an approximately semicircular shape. The total area of the flat surfaces 52b' of the first partition located in the vicinity of the two ends of the opening in the longitudinal direction is formed larger than the total area of the flat surfaces 52b of the first partition 52 formed in the vicinity of the straight portions (long side portions), and hence a large lyophilic area of the first partition 52 is ensured. In addition, the second partition 53 stands up along peripheral portions of the flat surfaces 52b and 52b' of the first partition 52 to form an inclined portion 53a, and a flat surface is formed outside of an outer peripheral portion of the inclined portion 53a.

Furthermore, the width (distance between the end portion of the first partition 52 in the longitudinal direction and the lower portion of the opening of the second partition 53) L2 of the flat surface 52b' of this first partition is formed larger than the width (distance between the long side of the opening of the first partition 52 and the lower portion of the opening of the second partition 53) L1. Accordingly, the inclined angle of the second partition formed along an approximately arc shape of the functional layer 45 becomes smaller than the inclined angle (long side portion) of the straight portion of the opening. The reason for this is believed as follows. When the second partition is formed from a liquid containing an organic resin, the compression strength of the second partition material applied to the arc portion is larger than that applied to the straight portion, and as a result, the inclined angle of the second partition having the arc shape is smaller than that in the vicinity of the straight portion (long portion) of the opening. Accordingly, the distance between the surface of the liquid containing a thin film material and the thin-film forming region surrounded by the first partition can be increased. Hence, the thin film-forming liquid material is prevented from gathering at the central portion of the opening which is caused by the surface tension.

In the pixel region described above, the total thickness of the functional layer 45 can be formed approximately equivalent to that of the first partition 52, and the thickness of the hole transport layer 45a can be formed not more than that of the first partition. In addition, the light-emitting layer 45b (functional layer 45) having a uniform thickness on the whole can be formed in the region (opening region of the first partition 52) including the two ends in the longitudinal direction surrounded by the first partition 52, and since a problem of the variation in thickness of the light-emitting layer 45b in which the thickness is large in the vicinity of the central portion of the light-emitting region and is small at the peripheral portion thereof may not arise, a uniform thickness of the light-emitting layer 45b can be obtained in the entire region. Hence, the generation of uneven light brightness within one pixel due to the variation in thickness of the light-emitting layer 45b can be reliably prevented, and a high quality electro-optic device can be formed.

<Method for Manufacturing Electro-Optic Device>

Next, one example of a method for manufacturing the electro-optic device 1 of this example will be described. Since the manufacturing method of this example is primarily equivalent to that described in Example 1, points different therefrom will only be described.

Figure 13A:
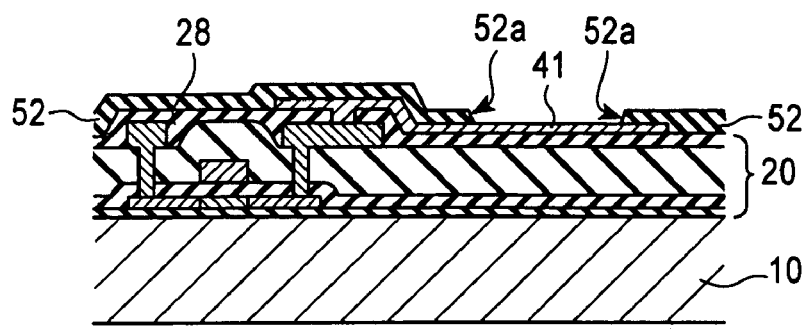
FIG. 13A is a cross-sectional view showing a step of manufacturing an electro-optic device.
Figure 13B:
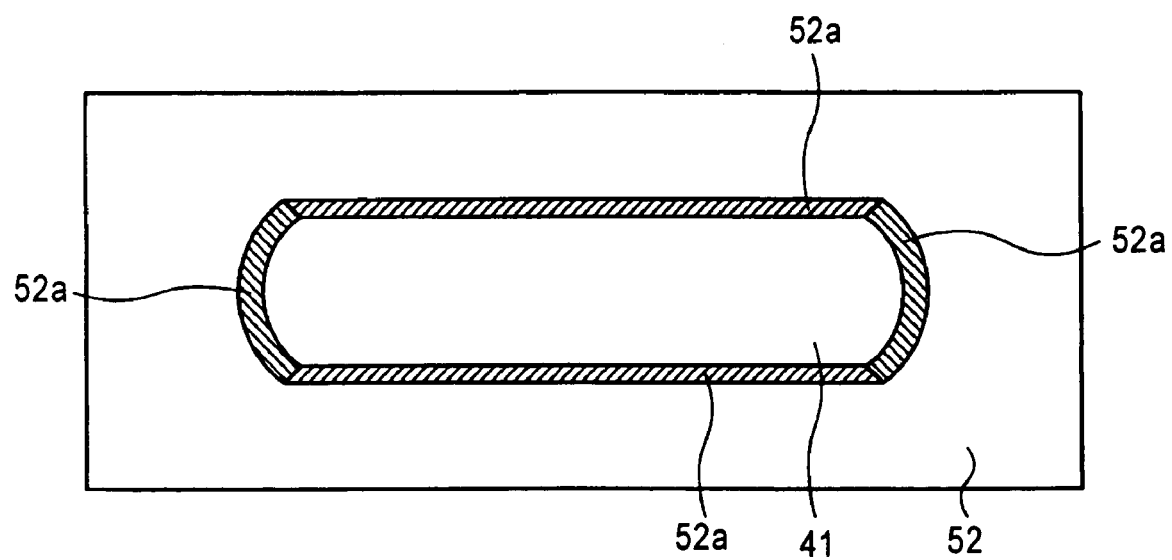
FIG. 13B is a cross-sectional view showing a step of manufacturing an electro-optic device.

In the first partition-formation step (S3), for example, a $SiO_2$ film is formed as a thin film to be formed into the first partition 52 on the patterned pixel electrode (anode) 41 and the third interlayer insulating film 28. Next, as shown in FIGS. 13A and 13B, this $SiO_2$ film is patterned to form the opening in which the functional layer 45 is to be formed at a predetermined position on the pixel electrode (anode) 41. As a result, the first partition 52 is formed on the peripheral portion of the pixel electrode (anode) 41 so as to surround the region in which the functional layer 45 is to be formed. In this example, the opening in which the functional layer 45 is to be formed has a long shape as shown in FIG. 13B, and the two ends of the opening in the longitudinal direction each have an arc shape. In addition, the upper portion of the opening of the first partition 52 is formed larger than the lower portion thereof. That is, the side surface of the first partition 52 is formed to have the inclined portion 52a with respect to the direction perpendicular to the surface of the substrate as shown in FIG. 13A.

Figure 13C:
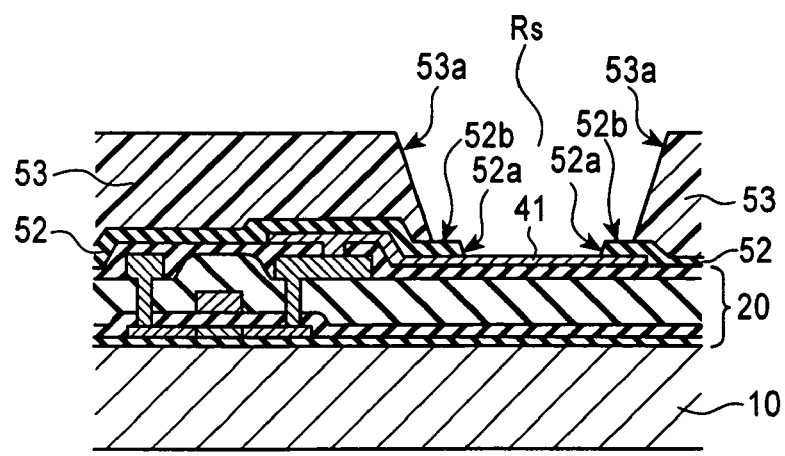
FIG. 13C is a cross-sectional view showing a step of manufacturing an electro-optic device.
Figure 13D:
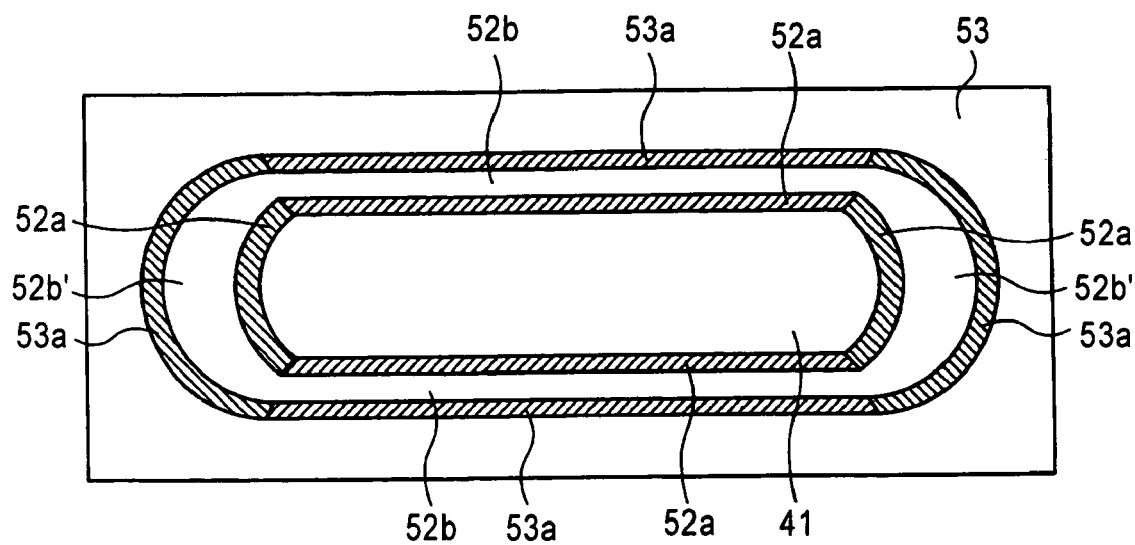
FIG. 13D is a cross-sectional view showing a step of manufacturing an electro-optic device.

In the second partition-formation step (S4), as shown in FIGS. 13C and 13D, the second partition 53 is formed so as to surround the region in which the functional layer 45 is to be formed. In this step, the second partition 53 is formed on the first partition 52 so as to expose the flat surfaces 52b and 52b' of the first partition 52, thereby exposing the upper portion of the first partition 52 when viewed from above. The second partition 53 is formed by patterning so as to have an approximately semicircular shape in the vicinity of each of the two ends of the opening of the first partition 52 in the longitudinal direction, that is, in the vicinity of each of the two ends of the functional layer 45 in the longitudinal direction. When the second partition 53 is formed as described above, the total area of the flat surfaces 52b' of the first partition in the vicinity of the two ends of the opening in the longitudinal direction is formed larger than that of the flat surfaces 52b of the first partition in the vicinity of the straight portions (long side portions) of the opening, and hence a large lyophilic area of the first partition 52 can be ensured.

In this example, the width (distance between the end portion of the first partition 52 in the longitudinal direction and the lower portion of the opening of the second partition 53) L2 of the flat surface 52b' of the first partition at each of the two ends of the opening in the longitudinal direction is formed larger than the width (distance between the straight portion (long side) of the opening of the first partition 52 and the lower portion of the opening of the second partition 53) L1. When L2 is formed larger than L1, the lyophilic area of the flat surface 52b' in the vicinity of each of the two ends of the opening is formed larger than that of the straight portion 52b of the opening, and hence a large area of the first partition 52 having a lyophilic property can be ensured. In this example, the two end portions of the opening in the longitudinal direction are each formed to have an arc shape; however, even when the shape described above is a straight shape, the structure equivalent to that described above may also be formed.

In this example as described above, among the flat surfaces of the first partition, since the flat surfaces of the first partition 52 in the vicinity of the two ends of the opening in the longitudinal direction, that is, in the vicinity of the two ends of the functional layer 45 in the longitudinal direction, are each formed to have an approximately semicircular shape, the flat surface 52b' of the first partition has an area larger than that of the flat surface 52b of the first partition formed in the vicinity of the straight portion (long side portion) of the opening, and as a result, a wide lyophilic area of the first partition 52 can be ensured. Accordingly, the thin film-forming liquid material for the light-emitting layer 45b is dried while being strongly pulled to the peripheral portions of the opening by the flat surfaces 52b' of the first partition 52 each of which has an ensured wide area in an approximately semicircular shape. Subsequently, since the thin film-forming liquid material is dried while being pulled, the thin film-forming liquid material is prevented from gathering at the central portion of the opening which is caused by the surface tension.

In general, when a thin film in a liquid phase is formed into a solid phase, the compression stress is generated, and the compression stress applied to an arc portion becomes larger than that applied to a straight portion. Accordingly, since the contact angle of a liquid droplet on the flat surface 52b' of the first partition located in the vicinity of the opening having an approximately semicircular shape becomes smaller than that on the flat surface in the vicinity of the straight portion (long side portion) of the opening, the liquid droplet widely wets the surface of the pixel electrode and the like and spreads thereon, and hence the droplet is prevented from gathering at the central portion of the opening.

As a result, the light-emitting layer 45b is formed over the entire region surrounded by the first partition 52 so as to have a uniform thickness, and hence uneven light brightness within one pixel caused by variation in film thickness is not generated.

EXAMPLE 2-2

Figure 14:
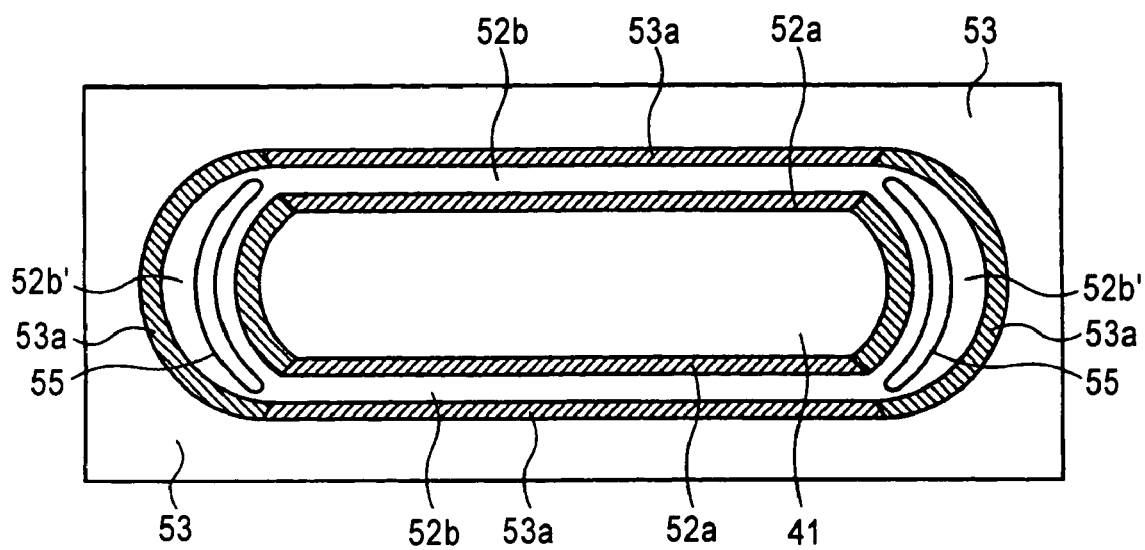
FIG. 14 is a plan view showing another example of the structure of a pixel region of an electro-optic device.

In addition, as one modification of the above example, the structure shown in FIG. 14 may also be formed. As shown in FIG. 14, in the flat surfaces 52b' having an approximately semicircular shape formed at the two ends of the opening of the first partition 52, arcuate concave portions 55 are formed along the shape of the two ends of the opening as a liquid pool for the thin film-forming liquid. When the concave portions 55 are formed, droplets are also stored therein, and as a result, the thin film-forming liquid material is more strongly pulled to the flat surfaces 52b' having an approximately semicircular shape. Since the thin film-forming liquid material is dried while more strongly being pulled to the two end sides, the liquid material is prevented from gathering at the central portion of the opening. As a result, in the region (the opening region of the first partition 52) surrounded by the first partition 52, the light-emitting layer 45b can be formed so as to have a uniform thickness, and hence a high quality electro-optic device can be formed in which the quality is not degraded due to the variation in thickness of the light-emitting layer 45b (functional layer 45).

In this example, as is the case in Example 1, the shape of the concave portion 55 is not specifically limited, and various shapes such as a cylindrical, a rectangular columnar, and a dimple shape may be optionally used. In addition, the depth of the concave portion 55 is not particularly limited and may be optionally determined in accordance with various conditions, such as the area of the flat surface 52b' of the first partition having an approximately semicircular shape and the amount of the thin film-forming liquid material filled in the liquid-droplet filling region Rs.

EXAMPLE 2-3

Figure 15:
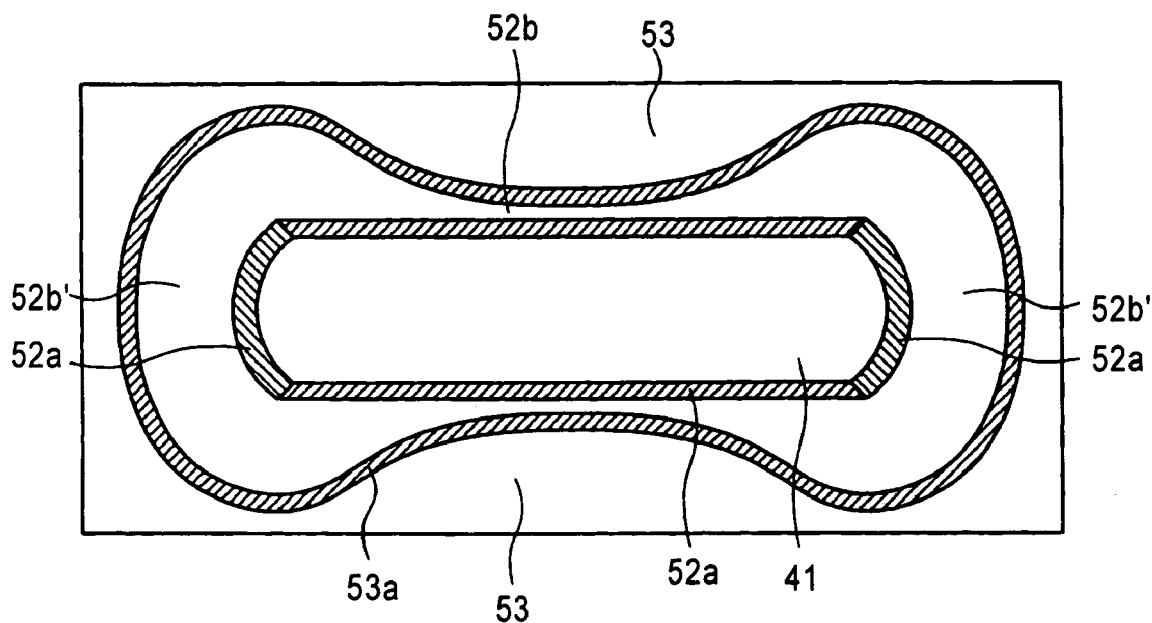
FIG. 15 is a plan view showing another example of the structure of a pixel region of an electro-optic device.

In addition, as another modified example, the structure shown in FIG. 15 may also be formed. According to the example shown in FIG. 15, based on the pixel structure shown in FIG. 12, the peripheral portions of the flat surfaces 52b and 52b' of the first partition are formed to have curved lines so that the area of each of the flat surfaces 52b of the first partition is decreased at the central portion of the opening along the straight portion (long side portion) and so that the area of each of the flat surfaces 52b' of the first partition is increased at the end of the opening in the longitudinal direction. According to this structure, the same advantage as described above can also be obtained, and the light-emitting layer 45b can be formed to have a uniform thickness in the entire region surrounded by the first partition 52. Hence, a high quality electro-optic device can be formed in which the quality is not degraded due to the variation in thickness of the light-emitting layer 45b (functional layer 45).

In Examples 1 and 2 described above, the case was described by way of example in which the pixel electrode 41 used as an anode and the counter electrode 46 used as a cathode form the functional element portion 40; however, the present invention is not limited thereto, and the pixel electrode 41 used as a cathode and the counter electrode 46 used as an anode may form the functional element portion 40. In addition, in Examples 1 and 2, the case of an active matrix electro-optic device was described in which TFTs are used as drive elements and switching elements; however, TFDs (thin film diode) may also be used as drive elements and switching elements. In addition to an active matrix electro-optic device, the manufacturing method of the present invention may also be applied to a method for manufacturing a passive matrix electro-optic device.

Furthermore, in Examples 1 and 2 described above, the case was described by way of example in which an electro-optic device having organic EL thin films is manufactured; however, the present invention may also be widely applied to the case in which thin films such as color filters are formed by a liquid-droplet discharge method for the formation of an electro-optic device. In addition, besides electro-optic devices, the present invention may be broadly applied to productions of semiconductor devices, display devices, and the like in which the formation of thin films is performed at predetermined positions by a liquid-droplet discharge method such as an ink-jet process.

EXPERIMENT 3-1

<Electro-Optic Device>

Figure 16:
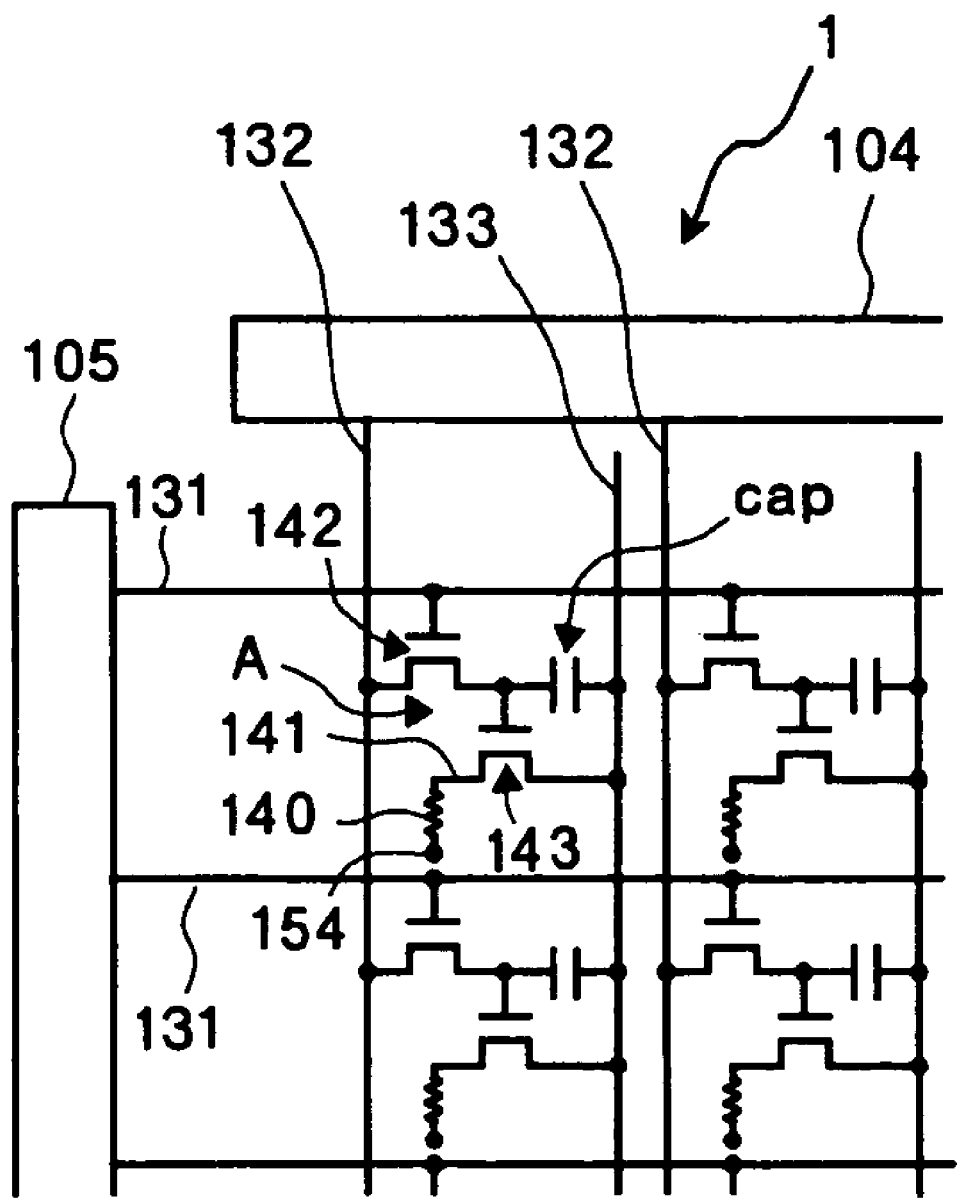
FIG. 16 is a plan view showing a wiring structure of an electro-optic device according to Example 3.
Figure 17A:
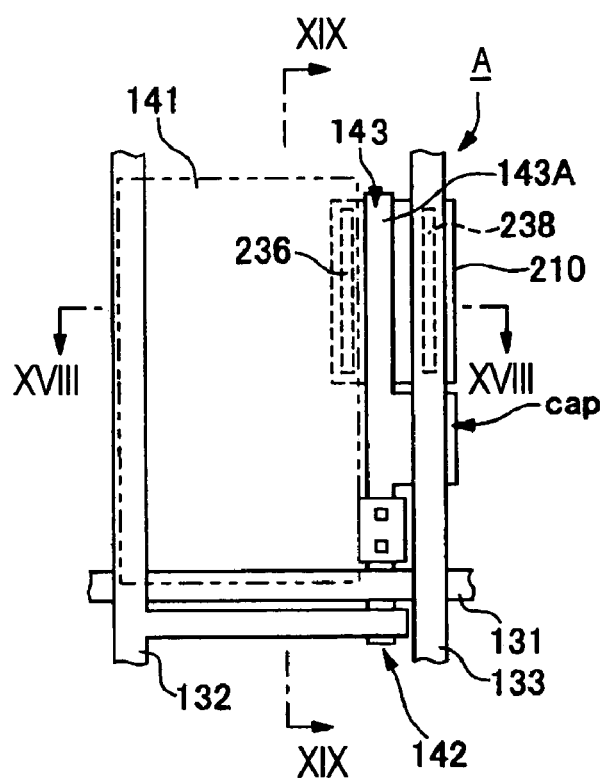
FIG. 17A is a plan view showing the structure of a pixel region according to Example 3.
Figure 17B:
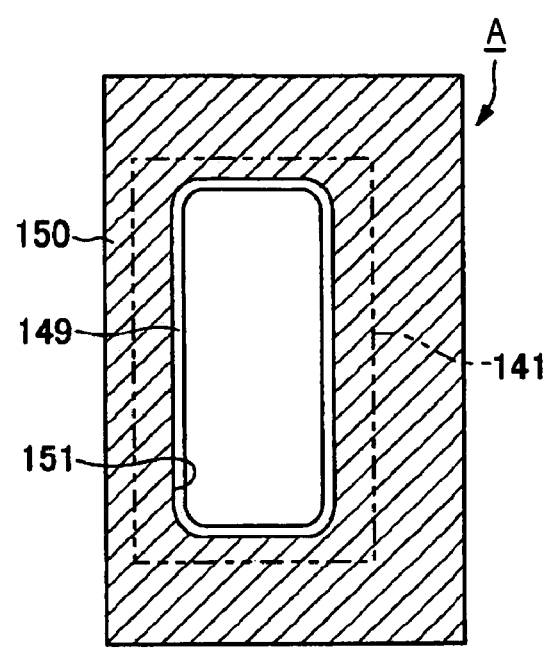
FIG. 17B is a plan view showing the structure of a pixel region according to Example 3.

FIGS. 17A and 17B are views each showing a plan structure of the pixel region A provided in an organic EL device 1 of the present invention. FIG. 17A is a view primarily showing a pixel drive portion such as a TFT of the pixel region A shown in FIG. 16, and FIG. 17B is a view showing a partition (parting member) and the like for defining between pixels. In addition, FIG. 18 is a cross-sectional structure taken along the line XVIII-XVIII in FIG. 17A, and FIG. 19 is a cross-sectional structure taken along the line XIX-XIX shown in the same figure as mentioned above.

In FIG. 17A, the pixel region A is formed of a pixel electrode 141 having an approximately rectangular shape when viewed from above; and a signal line 132, a common power supply line 133, a scanning line 131, and a scanning line for another pixel electrode (not shown in the figure), which are disposed along the four sides of the pixel electrode. According to the cross-sectional structure of the pixel region A shown in FIG. 18, a drive TFT 143 is formed on the substrate 10, and on an insulating film 240 formed to cover the drive TFT 143, an organic EL element 200 is further formed. The organic EL element 200 is primarily formed of an organic functional layer 140 provided in a region surrounded by a partition (second partition layer, parting member) 150 provided on the substrate 10 and has the structure in which this organic functional layer 140 is held between the pixel electrode 141 and a common electrode 154.

In the plan structure shown in FIG. 17B, the partition 150 has a partition region 151, which corresponds to a region in which the pixel electrode 141 is formed and which has an approximately rectangular shape when viewed from above, and inside this partition region 151, the organic functional layer 140 described above is to be formed. In addition, part of an inorganic partition 149 (the first partition layer which will be described later) extends inside the partition region 151 along the periphery thereof, and inside an opening of the inorganic partition 149, the organic functional layer 140 and the pixel electrode 141 are to be in contact with each other.

Figure 18:
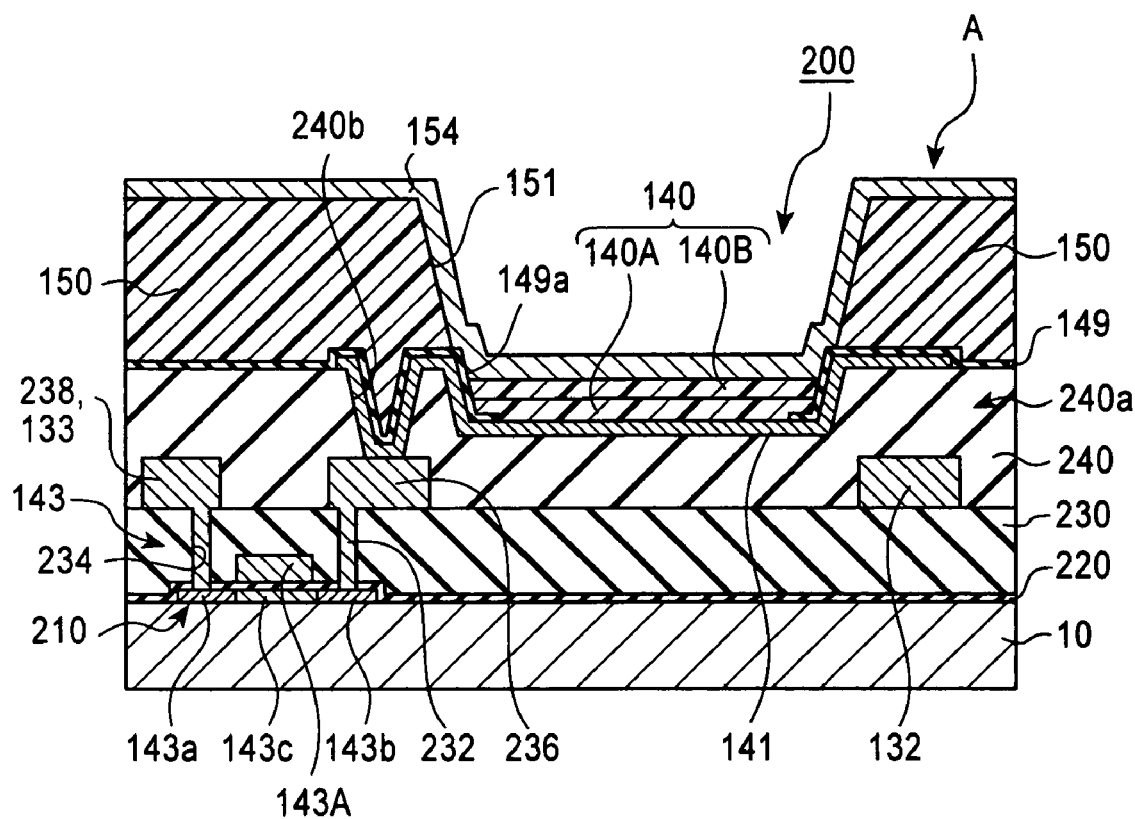
FIG. 18 is a cross-sectional view taken along the line XVIII-XVIII in FIG. 17.
Figure 19:
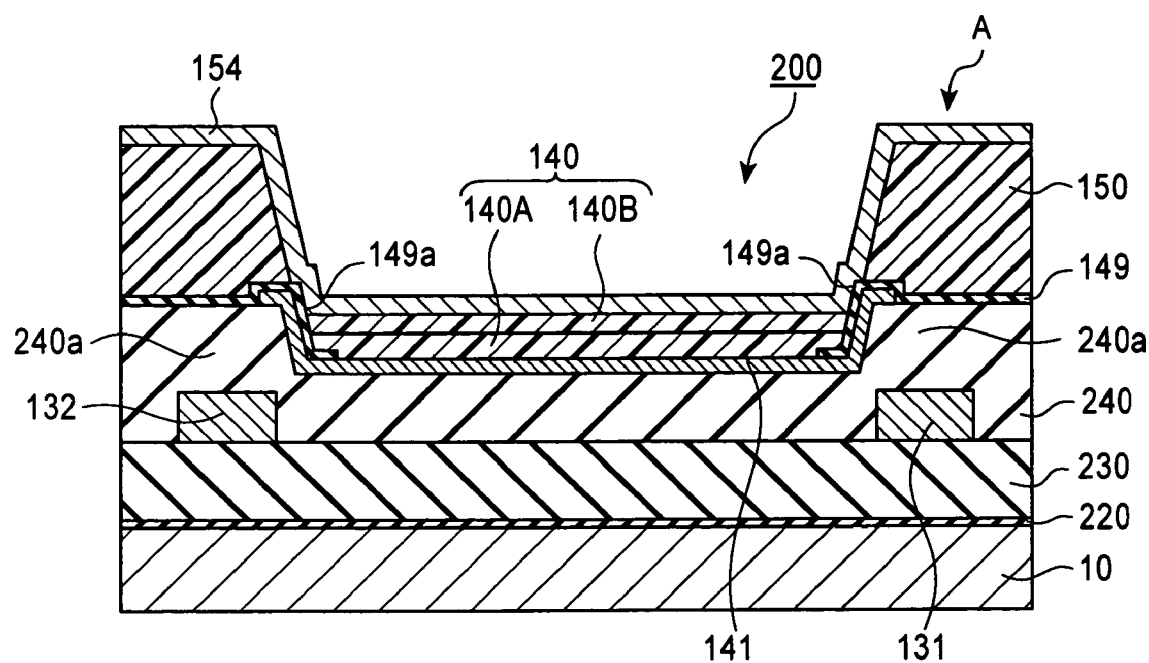
FIG. 19 is a cross-sectional view taken along the line XIX-XIX in FIG. 17.

As shown in FIG. 18, the drive TFT 143 is formed of a source region 143a, a drain region 143b, and a channel region 143c, which are formed in a semiconductor film 210, and a gate insulating film 220 and a gate electrode 143A formed on the surface of the semiconductor film. In addition, on this drive TFT 143, a first interlayer insulating film 230 is formed to cover the semiconductor film 210 and the gate insulating film 220, and through this first interlayer insulating film 230 and the gate insulating film 220, contact holes 232 and 234 extending to the semiconductor film 210 are formed. The drain electrode 236 and the source electrode 238 are connected to the drain region 143b and the source region 143a, respectively, through the contact holes described above.

On the first interlayer insulating film 230, a second interlayer insulating film 240 is further formed, and part of this second interlayer insulating film 240 protrudes upward which covers the signal line 132, the drain electrode 236, and the like, thereby forming a protruding portion 240a. This protruding portion 240a has an approximately rectangular shape when viewed from above so as to surround the organic functional layer 140, the rectangular shape being formed corresponding to the scanning line 131, the signal line 132, and the like which surround the pixel electrode 141 in plan view.

Films from the semiconductor film 210 to the second interlayer insulating film 240, which are formed between the substrate 10 and the organic EL element 200, form a circuit layer of the organic EL element of the present invention.

The pixel electrode 141 is formed so as to extend onto the protruding portion 240a which surrounds the periphery thereof. In addition, in a contact hole 240b formed through the second interlayer insulating film 240, a part of the pixel electrode 141 is filled so as to be connected to the drain electrode 236 through the contact hole 240b, and hence the pixel electrode 141 and the drive TFT 143 are electrically connected to each other.

The partition (first partition) 149 of the present invention is formed to cover part of the pixel electrode 141, which extends onto part of the protruding portion 240a, and is also formed to cover the protruding portion 240a. By the structure as described above, the partition 149 has an inclined portion 149a on the pixel electrode 141 along an inclined side surface of the protruding portion 240a. Furthermore, on the partition 149 made of an inorganic material, the partition (second partition) 150 made of an organic material is formed which is used as a parting member in the organic EL device together with the inorganic partition 149. A region surrounded by a sidewall surface of the partition 150 at the pixel electrode 141 side is the partition region 151. In addition, the sidewall surface of the partition 150 is located at a position apart from the inclined portion 149a of the inorganic partition at a predetermined distance toward the outside.

In this case, in addition to the function of isolating the pixel electrode 141, the partition 149 and the partition 150 have a function of forming a lyophilic region and a function of forming a lyophobic region, respectively, for forming the organic function layer 140 using a liquid phase method. In addition, it is preferable that the inorganic partition 149 which is disposed at a lower side have lyophilic property and that the partition 150 have a lyophobic property. Accordingly, the generation of inconvenience due to mixing of liquids between adjacent pixels can be suppressed.

In order to realize the difference in affinity for the liquid material as described above, the following method may be mentioned by way of example in which different materials are selected for the inorganic partition 149 and the partition 150, and surface modification treatment such as plasma treatment is then performed for the partitions 149 and 150. In addition to plasma treatment, the structure may also be used in which a lyophobic property is imparted to the partition 150 by mixing a fluorinated compound with an organic material forming the partition 150.

The organic EL element 200 described above is formed by the steps of forming a hole injection layer (electron transport layer) 140A and a light-emitting layer 145B in that order using a liquid phase method on the pixel electrode 141 in the partition region 151 surrounded by the partition 150, followed by the formation of a common electrode 154 covering the light-emitting layer 140B and the partition 150. In the case of this example, the hole injection layer 140A is formed to cover the pixel electrode 141 in the region surrounded by the inorganic partition 149 and to extend onto the peripheral portion thereof, and a side surface portion of the hole injection layer 140A is in contact with the inclined portion 149a of the inorganic partition 149. The light-emitting layer 140B is formed on the hole injection layer 140A, and a side surface portion of the light-emitting layer 140b is also in contact with the inclined portion 149a of the inorganic partition 149.

As the substrate 10, in the case of a so-called bottom emission type organic EL device, since the structure is used in which light is to be emitted from the substrate side, a transparent substrate such as a glass is used. In the case of a top emission type device, an opaque substrate may also be used.

In the case of a bottom emission type device in which light is to be emitted through the substrate 10, the pixel electrode 141 is formed of a light-transmitting conductive material such as ITO (indium tin oxide). In the case of a top emission type device, light-transmitting properties are not necessary, and an appropriate conductive material such as a metal material may be used. Since the hole injection layer 140A of this embodiment is formed by a liquid phase method, the surface of the pixel electrode 141 is preferably lyophilic, and since a water-base ink is used as a material for forming the hole injection layer 140A in many cases, a hydrophilic property is more preferable.

The common electrode 154 is provided over the substrate 10 so as to cover the upper surface of the light-emitting layer 140, the upper surface of the partition 150, and a wall surface forming the side surface portion of the partition 150. As a material for forming this common electrode 154, a light-reflecting metal material such as Al or Ag is used for a bottom emission type device, and a transparent conductive material is used for a top emission type device. As a transparent conductive material, ITO is preferable; however, another transparent conductive material may also be used.

At an upper side of the common electrode 154, a cathode protection layer may be formed. By providing the cathode protection layer as mentioned above, an effect of preventing corrosion of the common electrode 154 in manufacturing process can be obtained, and the cathode protection layer may be formed of an inorganic material such as a silicon compound including silicon oxide, silicon nitride, or silicon oxynitride. When the common electrode 154 is covered with the cathode protection layer made of an inorganic compound, intrusion of oxygen and the like into the common electrode 154 made of an inorganic oxide can be prevented. The thickness of the cathode protection layer is formed in the range of from approximately 10 to 300 nm.

In the above organic El device having the structure of this embodiment, since the first partition (inorganic partition) 149 surrounding the organic functional layer 140 extends inside the partition region 151, and this extending portion described above forms the inclined portion 149a in the partition region, the hole injection layer 140A and the light-emitting layer 140B can be planarized when the organic functional layer 140 is formed using a liquid phase method, and an organic functional layer having a uniform film thickness and uniform film properties can be formed. In addition, in the organic EL device of this embodiment, the extending portion of the inorganic partition 149 has an inclined shape, without decreasing an open area ratio of the pixel region, the area of the inorganic partition 149 exposed in the partition region 151 can be advantageously increased.

<Method for Manufacturing Electro-Optic Device>

Next, a method for manufacturing the organic EL device (electro-optic device) 1 using a liquid-droplet discharge device will be described with reference to FIGS. 23A to 24C. For the convenience of illustration in the figures, a single pixel region A (corresponding to the cross-sectional view shown in FIG. 19) is only shown in FIGS. 23A to 24C. For the organic EL device of the present invention, the structure in which light of an organic EL element is emitted from the substrate side (bottom emission) and the structure in which light is emitted from the side opposite to the substrate (top emission) may be used. In this embodiment, a bottom emission type organic EL device will be described.

Figure 23A:
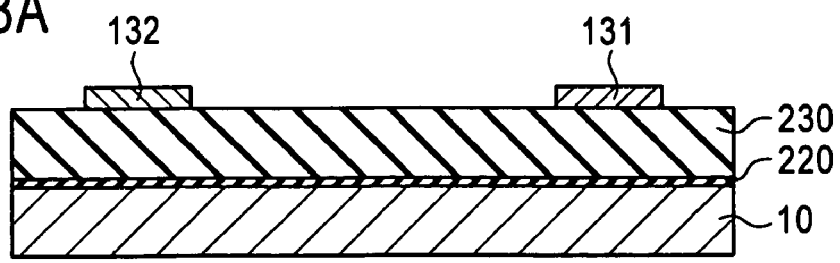
FIG. 23A is a cross-sectional view showing a step of manufacturing an electro-optic device.

First, as shown in FIG. 23A, in addition to the formation of the drive TFT 143 (not shown in the figure) on the substrate 10, the scanning line 131 and the signal line 132 are formed on the first interlayer insulating film 230. The substrate 10 of the bottom emission type organic EL device of this embodiment is a light-transmitting substrate which is made, for example, of a glass or quartz.

Figure 23B:
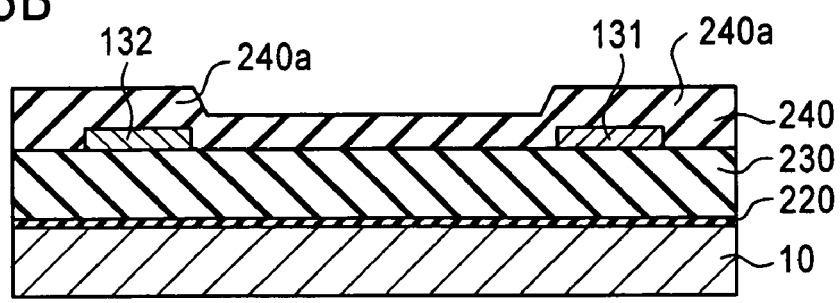
FIG. 23B is a cross-sectional view showing a step of manufacturing an electro-optic device.

Next, as shown in FIG. 23B, the second interlayer insulating film 240 is formed on the first interlayer insulating film 230 and upper surfaces of various wires. In this step, parts of the second interlayer insulating film 240 on the scanning line 131 and the signal line 132 protrude upward from the substrate 10 side in the figure to form a protruding portion 240a. That is, the second interlayer insulating film 240 is formed to have a thickness so as not to planarize concave and convex shapes caused by the scanning line 131 and the like formed on the first interlayer insulating film 230.

Figure 23C:
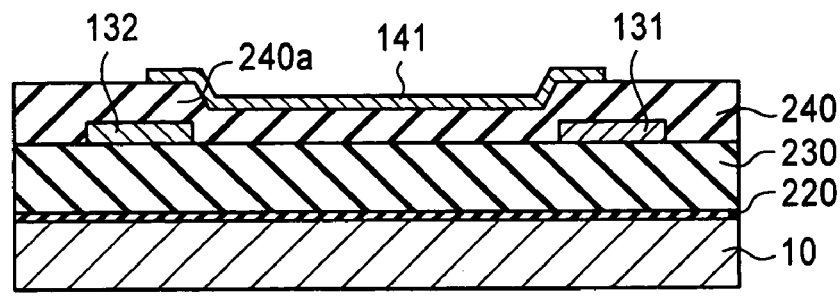
FIG. 23C is a cross-sectional view showing a step of manufacturing an electro-optic device.

Next, as shown in FIG. 23C, the pixel electrode 141 is formed by patterning using a known photolithographic technique. In this step, the pixel electrode 141 is formed so that the peripheral portion thereof extends onto the protruding portion 240a. In addition, although not shown in the figure, the pixel electrode 141 is electrically connected to the TFT 143 which is already provided on the substrate 10 (see FIG. 18). Accordingly, in the region surrounded by the signal line, the common power line, and the scanning lines as shown in FIG. 17A, the pixel electrode 141 is formed which is conductively connected to the drain region 143b of the drive TFT 143 through the drain electrode 236. In this embodiment, since the organic EL device is a bottom emission type device, the pixel electrode 141 is formed of a transparent conductive material such as ITO.

Figure 23D:
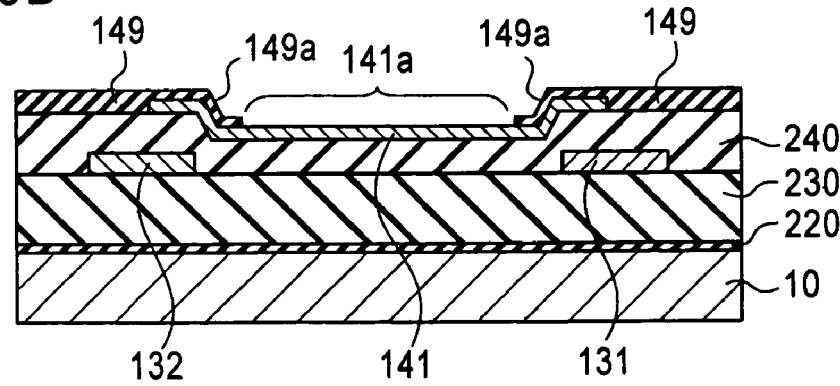
FIG. 23D is a cross-sectional view showing a step of manufacturing an electro-optic device.

Next, as shown in FIG. 23D, the inorganic partition (first partition layer) 149 made of an inorganic insulating material such as silicon oxide is formed so as to overlap the peripheral portion of the pixel electrode 141 in plan view.

In this step, the first inorganic partition 149 is formed so as to cover the protruding portion 240a. Accordingly, the first inorganic partition 149 can be formed to have the inclined portion 149a along the cross-sectional shape of the protruding portion 240a. In particular, after a silicon oxide film is formed so as to cover the pixel electrode 141 and the second interlayer insulating film 240, part of the silicon oxide film in a predetermined region (region indicated by reference numeral 141a in the figure) on the pixel electrode 141 is selectively etched so that the surface of the pixel electrode 141 is partly exposed.

Figure 24A:
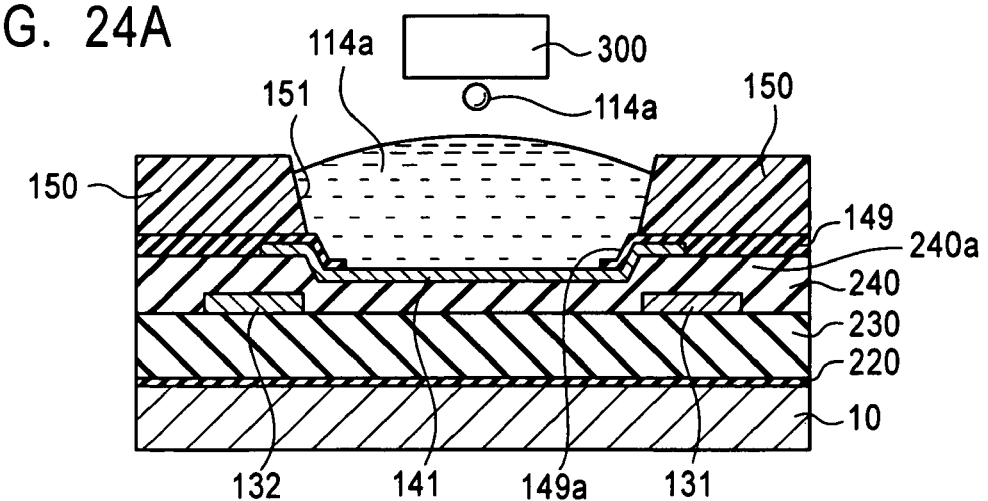
FIG. 24A is a cross-sectional view showing a step of manufacturing an electro-optic device.

Next, as shown in FIG. 24A, the second partition layer 150 made of an organic insulating material such as an acrylic or a polyimide resin is formed on the first inorganic partition 149 in a region on the protruding portion 240a.

The second partition 150 is formed so as to have a height of approximately 1 to 2 µm and so as to serve as a parting member for the organic EL element above the substrate 10. According to the structure described above, between an area in which the hole injection layer and the light-emitting layer of the organic El element are to be formed, that is, an area to which liquid materials for forming the above layers are to be applied, and the second partition 150 provided around the area described above, the partition region 151 is formed so as to have a sufficient height.

In addition, when this second partition 150 is formed, a wall surface of the second partition 150 forming the partition region 151 is formed at a position apart from the inclined portion 149a of the first inorganic partition 149 toward the side opposite to the region 151. When the inclined portion 149a of the first inorganic partition 149 is exposed in the partition region 151 as described above, the liquid material provided in a subsequent step can preferably wet the surfaces present in the partition region 151 and spread thereon.

After the second partition 150 is formed, lyophobic treatment is then performed for a region of the substrate including the second partition 150 and the pixel electrode 141. Since functioning as a parting member for isolating the organic EL element, the second partition 150 preferably has a property repellent (lyophobic) to the liquid material discharged from a liquid-droplet discharge head 300, and by the lyophobic treatment described above, a lyophobic property can be selectively imparted to the second partition 150.

As the lyophobic treatment, for example, a method for treating the surface of the partition using a fluorinated compound may be used. As the fluorinated compound, for example, $CF_4$, $SF_6$, and $CHF_3$ may be mentioned, and as the surface treatment, for example, plasma treatment and UV radiation treatment may be mentioned.

In the lyophobic treatment as described above, even when the entire surface of the substrate is treated, since the surface of the inorganic pixel electrode 141 made of an ITO film and the surface of the first inorganic partition 149 made of silicon oxide are unlikely to have a lyophobic property as compared to the surface of the second partition 150 made of an organic material, the surface of the second partition 150 is only selectively processed to have a lyophobic property, and hence a plurality of areas which have different affinities for the liquid material is formed in the region surrounded by the second partition 150.

Alternatively, when a resin material containing a fluorine compound is used as a molding material for forming the second partition 150, the second partition 150 can be formed to have a lyophobic property equivalent to that described above.

After the lyophobic treatment, as shown in FIG. 24A, while the upper surface of the substrate 10 is being turned up, a liquid material 114a containing a hole injection layer-forming material is selectively applied to the region surrounded by the second partition 150 using the liquid-droplet discharge head 300. The liquid material 114a for forming the hole injection layer contains the hole injection layer-forming material and a solvent.

When the liquid material 114a containing the hole injection layer-forming material is discharged over the substrate 10 by the liquid-droplet discharge device 300, since the second partition 150 is formed so as to surround the area onto which the liquid material is applied, the liquid material 114a is not allowed to flow outside over the second partition 150. In addition, in this embodiment, since the surface of the pixel electrode 141 is a lyophilic region, and the surface of the first inorganic partition 149 surrounding the periphery thereof has a higher affinity for the liquid material than the surface of the pixel electrode 141, the liquid material 114a applied onto the pixel electrode 141 is allowed to wet the pixel electrode 141, to spread over the entire surface thereof, and to be uniformly filled inside the second partition 150.

Figure 24B:
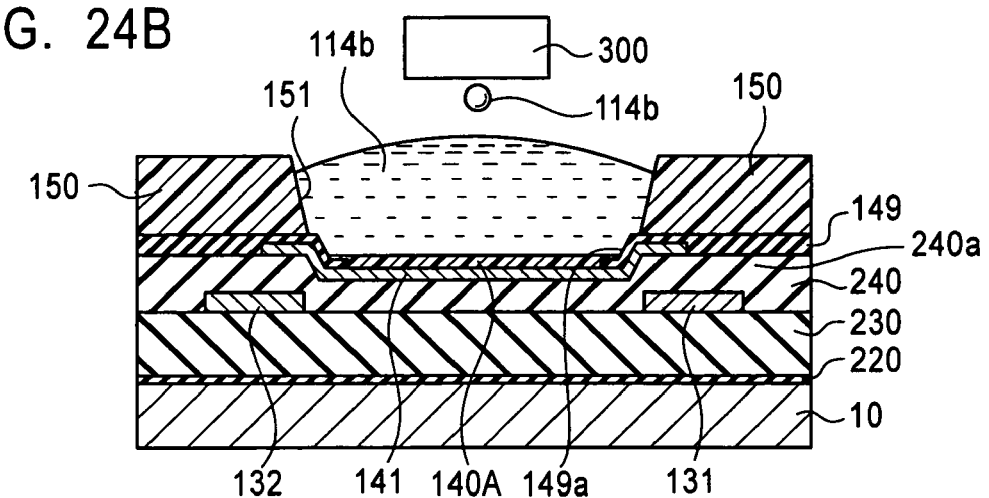
FIG. 24B is a cross-sectional view showing a step of manufacturing an electro-optic device.

Next, as shown in FIG. 24B, the solvent of the liquid material 114a is evaporated by heating or light radiation to form the hole injection layer 140A in a solid form on the pixel electrode 141. Alternatively, under atmospheric conditions or a nitrogen gas atmosphere, firing at a predetermined temperature and time (for example, 200° C. for 10 minutes) may be performed. Or, at a pressure lower than atmospheric pressure (under an evacuated state), the solvent may be removed. In the step of applying the liquid material, shown in FIG. 24A, the liquid material uniformly wets the pixel electrode 141 and the like inside the second partition 150 and spreads thereon, and hence as shown in FIG. 24B, the hole injection layer 140A is obtained in a flat shape having a uniform thickness.

Subsequently, as shown in FIG. 24B, while the upper surface of the substrate 10 is being turned up, a liquid material 114b containing a solvent and a light-emitting layer-forming material is selectively applied onto the hole injection layer 140A inside the second partition 150 by the liquid-droplet discharge head 300.

As the light-emitting layer-forming material, for example, a material may be preferably used which contains a precursor of a conjugated organic polymeric compound and a fluorescent pigment for changing light-emitting properties of a light-emitting layer to be obtained. The precursor of a conjugated organic polymeric compound is a material which can form a light-emitting layer composed of a conjugated polymeric organic EL layer. For the formation of this light-emitting layer, the precursor is first discharged from a liquid-droplet discharge head together with a fluorescent pigment or the like to form a thin film, followed by heating for curing. As the precursor, for example, there may be mentioned a sulfonium salt precursor in which when a sulfonium group is eliminated by heat treatment, a conjugated organic polymeric compound is obtained.

Figure 24C:
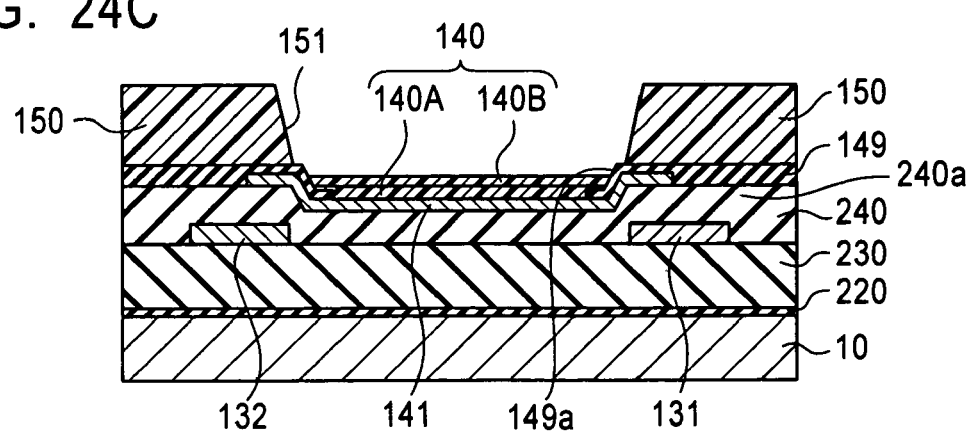
FIG. 24C is a cross-sectional view showing a step of manufacturing an electro-optic device.

After the liquid materials 114b containing light-emitting layer-forming materials having individual colors are discharged and applied, the solvent in the liquid materials 114b is evaporated. By this step, as shown in FIG. 24C, the light-emitting layer 140B in a solid form is formed on the hole injection layer 140A, and by this formation, the organic functional layer 140 composed of the hole injection layer 140A and the light-emitting layer 140B is formed. In this step, for the evaporation of the solvent in the liquid material 114b containing a light-emitting layer-forming material, evaporation may be carried out by heating or at a reduced pressure whenever necessary. However, in general, since the liquid material containing a light-emitting layer-forming material has good drying characteristics and is quick drying, without performing particular treatment as described above, by sequentially discharging and applying the liquid materials containing light-emitting layer-forming materials having individual colors, the light-emitting layers 140B can be formed having individual colors in accordance with the order of application. In addition, as described above, since the surface of the hole injection layer 140A, which is to be supplied with the liquid material 114b, is preferably planarized, the light-emitting layer 140B formed on the hole injection layer 140A also has a superior flatness, and as a result, uniform film thickness and quality can be obtained. Since the liquid material 114b is dried while being in contact with the inclined portion 149a of the first partition 149, uneven distribution of the liquid material can be prevented by the inclined portion 149a, and hence more superior uniformity can be realized.

As has thus been described, according to the method for manufacturing an electro-optic device, of the present invention, when the partition 150 and the organic EL element 200 are formed over the substrate 10, since the inorganic partition 149 having the inclined portion 149a is formed to extend to the peripheral portion of the pixel electrode 141, and the liquid material 114a is then supplied inside the partition 150, the liquid material is effectively prevented from being changed into a spherical shape on the surface of the pixel electrode 141, and hence the liquid material is allowed to uniformly wet the surface of the pixel electrode 141 and the like and spread thereon. As a result, the liquid material can be solidified by drying so as to have a uniform thickness. In addition, due to the uniform thickness of the hole injection layer 140a, the light-emitting layer 140B can be formed to have a uniform thickness. Accordingly, since uniform light-emitting properties can be obtained in the pixel region A, and the uniform film thickness can also be obtained, a highly reliable organic EL element 200 can be formed in which short-circuiting between electrodes is not likely to occur.

In addition, since the protruding portion 240a of the second interlayer insulating film 240, which is used for forming the inorganic partition 149 having the inclined portion 149a, is formed along the concave and convex shapes caused by the scanning line 131 and the signal line 132 formed together with the TFT 143 and the like for driving the pixel, by adjusting the thicknesses of these wires and the thickness of the second interlayer insulating film 240, the height of the protruding portion 240a can be easily controlled. Since being the same as that described in Example 1, steps of the manufacturing method of this example other than those described above are omitted.

EXAMPLE 3-2

In the embodiment described above, the case in which the protruding portion 240a is formed by the presence of the concave and the convex shapes of the wires (scanning line 131, signal line 132, and the like) provided thereunder was described; however, according to the electro-optic device of the present invention, the structure may also be formed in which conductive members such as dummy wires and the like may be formed for forming the protruding portion 240a.

Figure 20A:
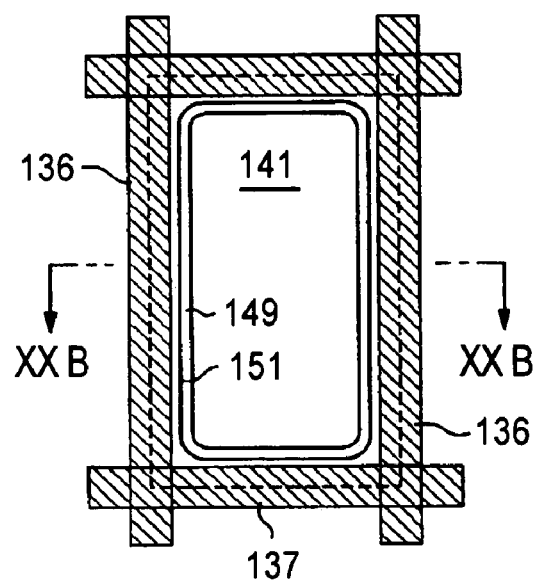
FIG. 20A is a plan view showing another example of the structure of a pixel region.
Figure 20B:
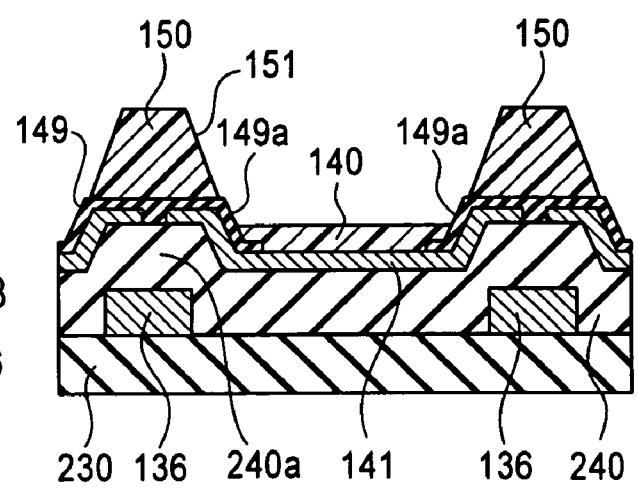
FIG. 20B is a cross-sectional view showing another example of the structure of a pixel region.

FIG. 20A is a plan view showing a pixel structure of an organic EL device provided with the dummy wires as described above. FIG. 20B is a cross-sectional view showing the structure taken along the line XXB-XXB in FIG. 20A, and in this figure, wires and the like connected to the substrate and the TFT are omitted. In FIGS. 20A and 20B, the same reference numerals of the constituent elements shown in FIGS. 16 to 19 designate the same constituent elements, and descriptions thereof will be omitted.

In the organic EL device of this embodiment, as shown in FIG. 20A, a plurality of dummy wires 136 and 137 is provided along sides of the pixel electrode (rectangular region indicated by a dotted line) 141. In other words, the pixel electrode 141 is disposed in a rectangular region surrounded by the dummy wires 136 and 137. In addition, according to a cross-sectional structure shown in FIG. 20B, the dummy wires 136 are formed on the first interlayer insulating film 230, and the second interlayer insulating film 240 formed on the first interlayer insulating film 230 to cover these dummy wires 136 has a portion (protruding portion 240a) protruding upward in a region formed above the dummy wires 136, the protruding portion being formed along the concave and convex shapes caused by the dummy wires 136 formed on the first interlayer insulating film 230. The pixel electrode 141 is formed on the second interlayer insulating film 240 to extend onto the protruding portion 240a, and the inorganic partition 149 formed in a region including the pixel electrode 141 provided on the protruding portion 240a has the inclined portion 149a at the central side of the pixel electrode 141. In addition, the partition 150 is formed on the inorganic partition 149, and the organic functional layer 140 is formed in the partition region 151 surrounded by the partitions 149 and 150.

According to the organic EL device of this embodiment having the structure described above, as is the organic EL device in the previous embodiment, when the organic functional layer 140 is formed using a liquid phase method, a material for forming the organic EL element is prevented from being unevenly distributed in the partition region 151, and hence the organic functional layer 140 can be formed to have a uniform thickness and quality. Hence, short-circuiting between electrodes and variation in light brightness due to uneven film thickness and quality are unlikely to occur, and as a result, a high quality light emission can be obtained.

In addition, when the dummy wires 136 and 137 are disposed along the sides of the pixel electrode 141 as is the case of this embodiment so as to form the protruding portion 240a, the height (that is, the height of the inclined portion 149a) of the protruding portion 240a can be optionally controlled by the thicknesses of the dummy wires 136 and 137, and hence the change in film thickness of the organic functional layer 140 can also be easily performed. In addi-tion, the dummy wires 136 and 137 may be formed on the same layer or may be formed on different layers. When being formed on the same layer, the dummy wires 136 and 137 may be integrated to form a grating shape when viewed in plan view.

EXAMPLE 3-3

Figure 21A:
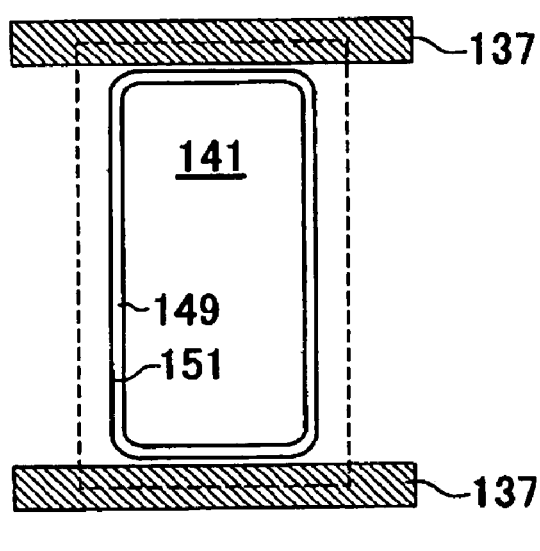
FIG. 21A is a plan view showing another example of the structure of a pixel region.
Figure 21B:
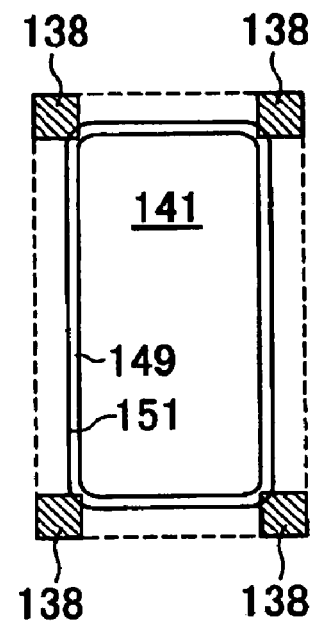
FIG. 21B is a plan view showing another example of the structure of a pixel region.

In the above embodiment, the case was described in which the dummy wires 136 and 137 are disposed so as to surround the pixel electrode 141 when viewed in plan view, and since the dummy wires are different from the scanning lines and the signal lines forming the drive portions, the placement of the dummy wires is not substantially limited. Accordingly, the structure may be formed in which the dummy wires are formed locally in the vicinity of the pixel electrode 141. FIGS. 21A and 21B are views of plane structures showing variation in placement of dummy wires. FIG. 21A shows the case in which the dummy wires 137 are disposed along the two short sides of the pixel electrode 141 in the longitudinal direction, and FIG. 21B shows the case in which dummy wires 138 are disposed at the corners of the pixel electrode 141.

As described above, the liquid material disposed in the partition region 151 tends to be changed into a more stable spherical shape; however, when the partition region 151 has an approximately rectangular shape as shown in FIGS. 21A and 21B, the liquid material is liable to be unevenly distributed. Accordingly, as shown in FIG. 21A, when the dummy wires 137 are disposed along the two short sides of the partition region 151 in the longitudinal direction, a holding force for holding the liquid material of each of the two sides of the partition region 151 in the longitudinal direction can be increased, the liquid material being liable to be separated from the inorganic partition 149 at the two sides mentioned above. As a result, the liquid material is allowed to uniformly wet the surface of the pixel electrode 141 and spread thereon, and hence an organic functional layer having a uniform film thickness and quality can be formed in the partition region 151.

In addition, when the partition region 151 has corners in a convex shape extending outside when viewed in plan view, the liquid material is also liable to be separated from the convex-shape corners mentioned above. Accordingly, as shown in FIG. 21B, when the dummy wires 138 are disposed at four corners (individual convex-shape corners) of the partition region 151, the liquid material is prevented from being unevenly distributed in the partition region 151, and as a result, the organic functional layer 140 can be formed to have a uniform film thickness and quality.

EXAMPLE 3-4

Figure 22:
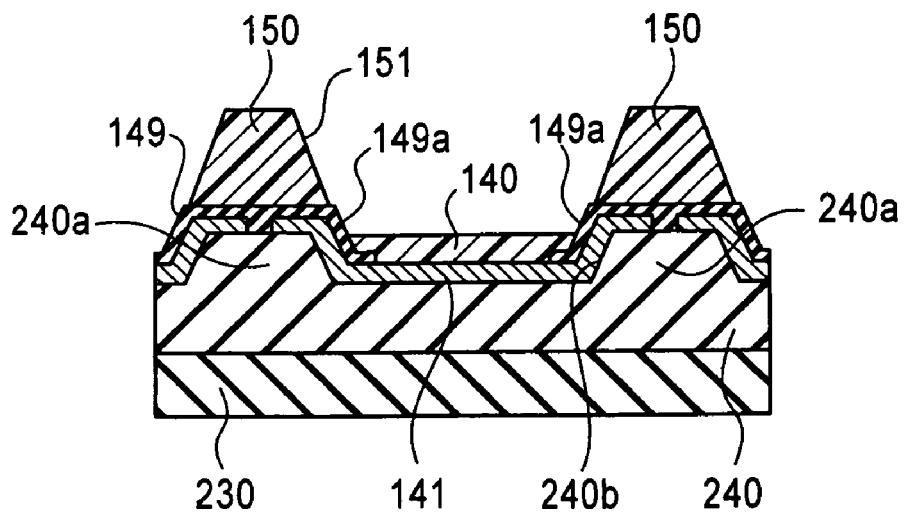
FIG. 22 is a cross-sectional view showing another example of the structure of a pixel region.

FIG. 22 is a view showing an organic EL device of another embodiment according to the present invention and is a cross-sectional view corresponding to FIG. 20B shown in the previous embodiment.

In the individual embodiment described above, the case was described in which the first inorganic partition 149 having the inclined portion 149a is formed using the protruding portion 240a formed by the wires (scanning line, signal line, dummy line, and the like) which are provided at the lower side of the pixel electrode 141. However, as shown in FIG. 22, when a recess portion 240b is formed in the second interlayer insulating film 240, the protruding portion 240a may be formed around the recess portion. In this case, the first interlayer insulating film 230 provided with TFTs and the like is covered with the second interlayer insulating film 240 to form a planarized surface, and the recess portion 240b is then formed at a predetermined position in the second interlayer insulating film 240 by etching.

When the protruding portion 240a is formed by removing a part of the second interlayer insulating film 240 which is used as the planarizing layer as described above, the recess portion 240b can be simultaneously formed with a contact hole for connecting between the pixel electrode 141 and the TFT provided under the insulating film, and hence improvement in efficiency of the process and reduction in manufacturing cost can both be realized.

EXAMPLE 4

Figure 25:
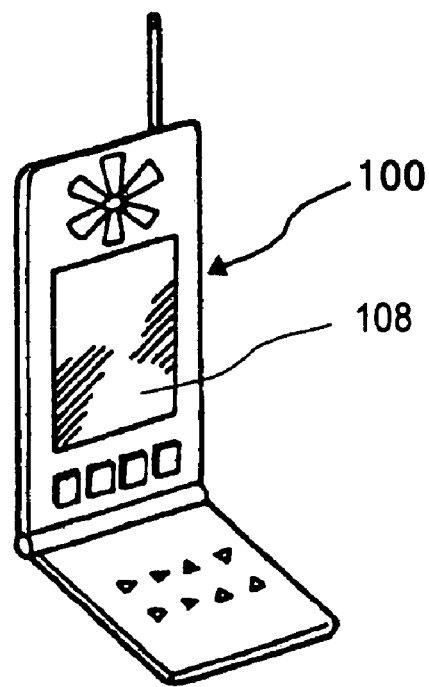
FIG. 25 is a schematic view showing an example of an electronic apparatus.
Figure 26:
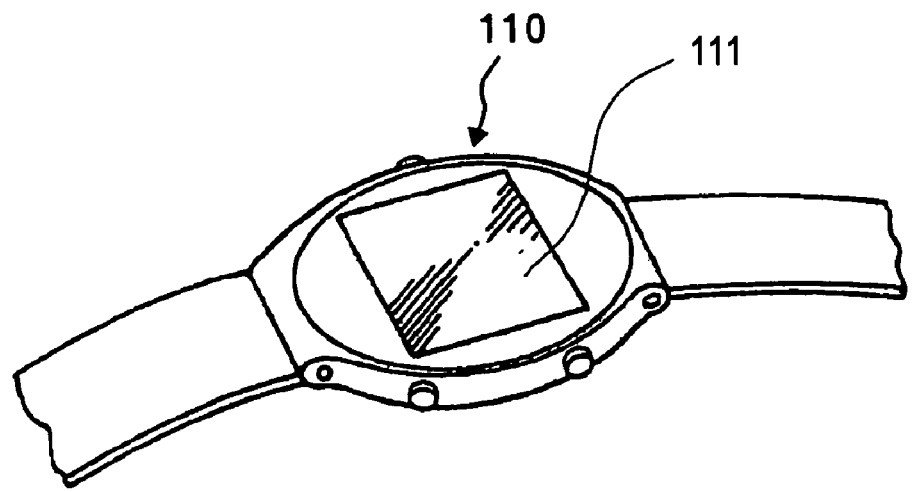
FIG. 26 is a schematic view showing an example of an electronic apparatus.
Figure 27:
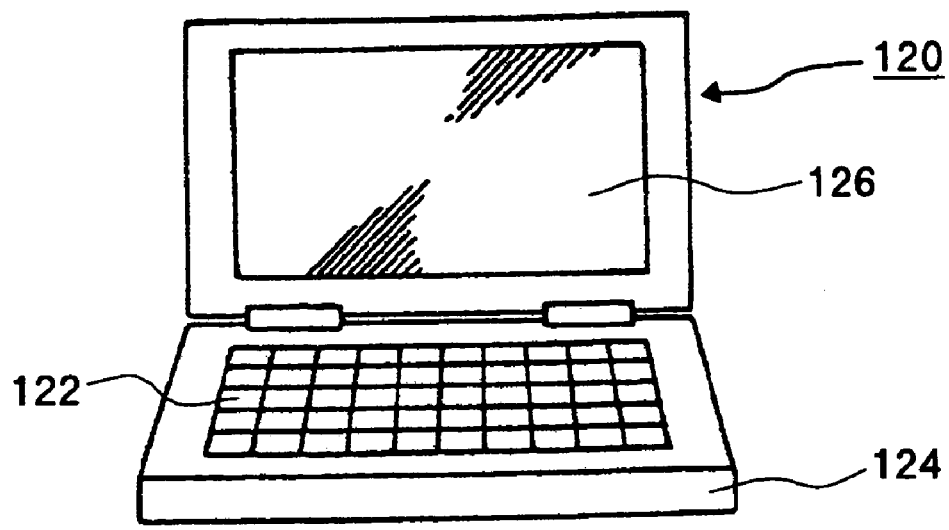
FIG. 27 is a schematic view showing an example of an electronic apparatus.
Figure 28:
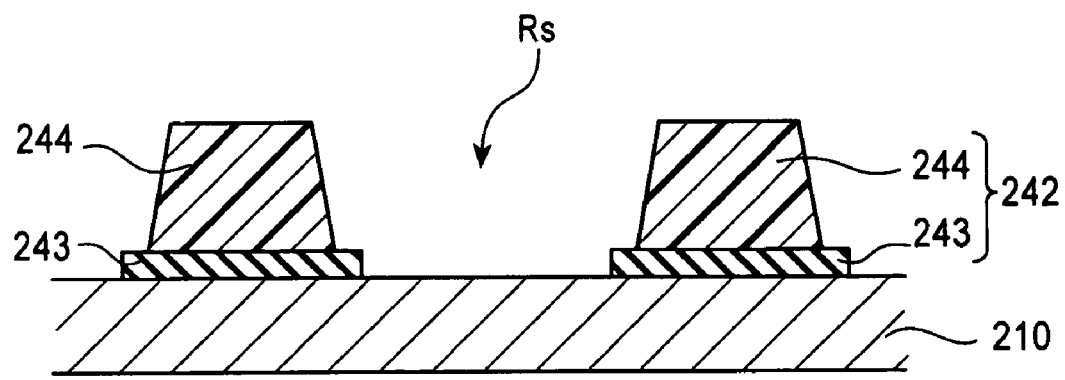
FIG. 28 is a cross-sectional view of an important portion of a pixel portion of a conventional electronic apparatus.
Figure 29:
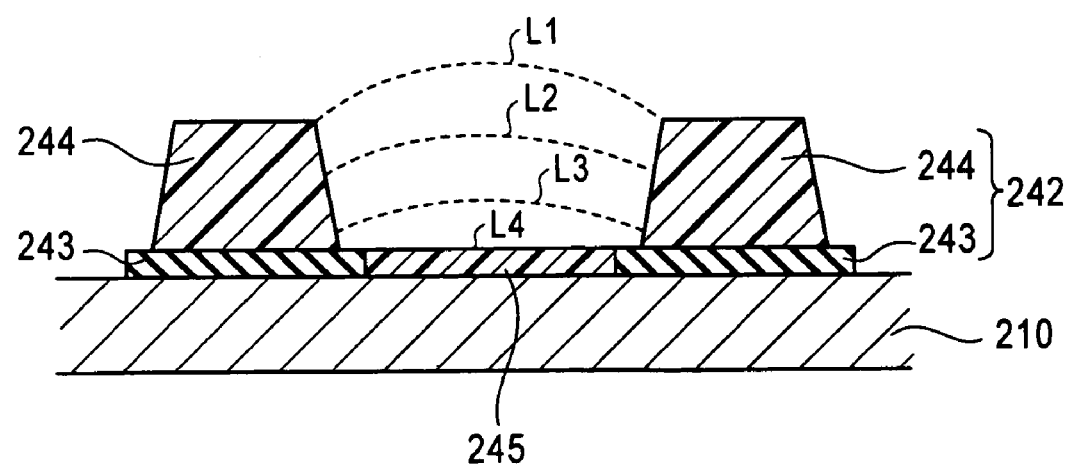
FIG. 29 is a schematic view showing a process for forming a thin film of a conventional electro-optic device.
Figure 30:
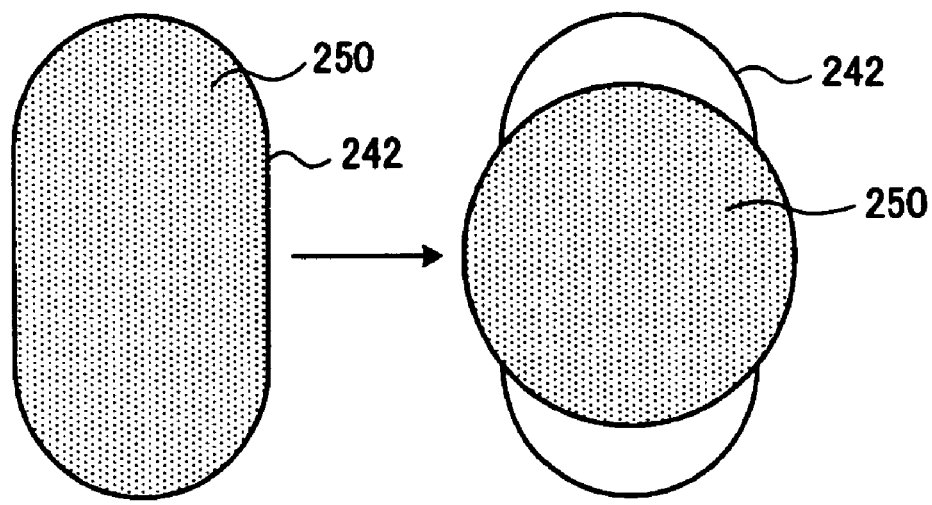
FIG. 30 is a schematic view showing a process for forming a thin film of a conventional electro-optic device.
Figure 31:
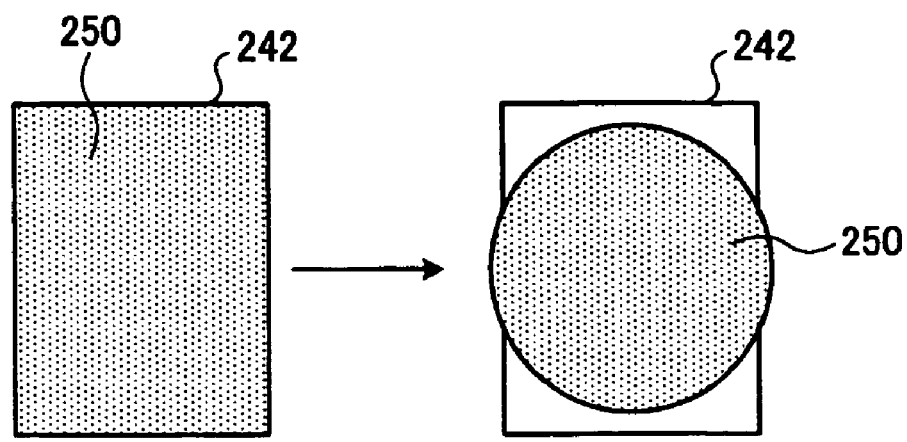
FIG. 31 is a schematic view showing a process for forming a thin film of a conventional electro-optic device.

In Example 4, electronic apparatuses provided with the electro-optic devices described in Examples 1, 2, and 3 will be described. FIGS. 25 to 27 show examples of the electronic apparatuses provided with the electro-optic devices according to the present invention. FIG. 25 is a perspective view showing an example of a mobile phone. Reference numeral 100 indicates a mobile phone body, and reference numeral 108 indicates a display portion made of the electro-optic device of the present invention. FIG. 26 is a perspective view showing an example of a wristwatch type electronic apparatus. Reference numeral 110 indicates a watch body incorporating a watch function, and reference numeral 111 indicates a display portion made of the electro-optic device of the present invention. In addition, FIG. 27 is a perspective view showing an example of a portable information processing apparatus such as a word processor or a personal computer. In FIG. 27, reference numeral 120 indicates a portable information processing device, reference numeral 122 indicates an input portion such as a keyboard, reference numeral 124 indicates a portable information processing device body in which computing means, memory means, and the like are stored, and reference numeral 126 indicates a display portion made of the electro-optic device of the present invention.

In the electronic apparatuses described above, when the electro-optic device of the present invention is used, high quality electronic apparatuses can be realized. In addition, as long as the electro-optic device can be incorporated, the electronic apparatuses are not limited to those described above. Accordingly, as electronic apparatuses each provided with the electro-optic device as described above, besides the mobile phone shown in FIG. 25, the wristwatch type electronic apparatus shown in FIG. 26, and the portable information processing apparatus shown in FIG. 27, for example, there may be mentioned, digital still cameras, monitors for automobile use, digital video cameras, view finder type or monitoring type video tape recorders, car navigation systems, pagers, electronic notebooks, electronic calculators, workstations, TV telephones, and POS terminals.

INDUSTRIAL APPLICABILITY

As has thus been described, according to the electro-optic device and the manufacturing method thereof, according to the present invention, a uniform thin film can be formed in the entire region defined by the partition, and in particular, an electro-optic device which strictly requires superior optical properties can be advantageously realized, the superior optical properties being determined by the uniformity of a film thickness.

What is claimed is:

1. An electro-optic device comprising:
   thin films provided on thin film-forming surfaces, the thin films being functional thin film layers, each thin film-forming surface having at least one corner portion; and
   partition members surrounding the at least one corner portion of the thin film-forming surfaces, each partition member defining a predetermined partition region,
   each partition member including a first partition having a lyophilic surface and a second partition which is provided on the first partition and which has a lyophobic surface,
   the first partition of each partition member having flat surfaces approximately parallel to a corresponding one of the thin film-forming surfaces, each flat surface having an exposed part that is not covered with the second partition,
   an exposed part of a flat surface of the first partition in the vicinity of the corner portion having a larger two-dimensional area in plan view than an exposed area of a flat surface of the first partition at a position other than that in the vicinity of the corner portion.

2. The electro-optic device according to claim 1,
   wherein the second partition has an opening having an arc shape at a position in the vicinity of the corner portion, and
   an inclined angle of the second partition in the vicinity of the corner portion is smaller than that of the second partition at a position other than that in the vicinity of the corner portion.

3. The electro-optic device according to claim 1,
   wherein each of the thin film-forming surfaces surrounded by the first partition has a long shape, and
   an exposed area of flat surfaces of the first partition in the vicinity of two end portions of the long shape in the longitudinal direction is larger than an exposed area of flat surfaces of the first partition at positions other than that in the vicinity of said two end portions.

4. The electro-optic device according to claim 3,
   wherein the second partition has an opening having arc shapes in the vicinity of said two end portions of the long shape in the longitudinal direction, and
   an inclined angle of the second partition in the vicinity of each of said two end portions is smaller than that at each of positions other than that in the vicinity of said two end portions.

5. The electro-optic device according to claim 1,
   wherein the first partition has at least one inclined portion as the exposed part which is not covered with the second partition.

6. The electro-optic device according to claim 5,
   wherein the inclined portion is provided along a peripheral portion of the partition region.

7. The electro-optic device according to claim 5,
   wherein the partition region has an approximately rectangular shape when viewed in plan view, and the inclined portion is provided along a short side of the partition region.

8. The electro-optic device according to claim 5,
   wherein the partition region has an approximately polygonal shape when viewed in plan view, and the inclined portion is provided so as to correspond to at least one outwardly convex corner of the partition region.

9. The electro-optic device according to claim 5, further comprising a substrate and circuit layers which are provided between the substrate and the partition members, wherein the circuit layers have protruding portions at positions at which the circuit layers are overlapped with the partition members in plan view.

10. The electro-optic device according to claim 9, wherein the circuit layers further have conductive members provided below the protruding portions.

11. The electro-optic device according to claim 1, wherein the first partition is primarily composed of an inorganic material, and the second partition is primarily composed of an organic material.

12. The electro-optic device according to claim 1, wherein the functional thin film layers are organic electroluminescent films.

13. An electro-optic device comprising:
thin films provided on thin film-forming surfaces, the thin films being functional thin film layers, each thin film-forming surfaces having at least one corner portion; and
partition members surrounding the at least one corner portion of the thin film-forming surfaces, each partition member defining a predetermined partition region, the partition members each including a first partition having a lyophilic surface and a second partition which is provided on the first partition and which has a lyophobic surface, the first partition of each partition member having flat surfaces approximately parallel to a corresponding one of the thin film-forming surfaces, each flat surface having an exposed part which is not covered with the second partition, an exposed part of a flat surface of the first partition in the vicinity of the corner portion having a larger two-dimensional area in plan view than an exposed area of a flat surface on the first partition at a position other than that in the vicinity of the corner portion, the second partition having an opening with an arc shape at a position in the vicinity of the corner portion, an inclined angle of the second partition in the vicinity of the corner portion being smaller than that of the second partition at a position other than that in the vicinity of the corner portion.

* * * * *